United States Patent [19]
Levy

[11] Patent Number: 5,673,028
[45] Date of Patent: Sep. 30, 1997

[54] ELECTRONIC COMPONENT FAILURE INDICATOR

[76] Inventor: Henry A. Levy, 402 Foster Ave., Brooklyn, N.Y. 11230

[21] Appl. No.: 1,321

[22] Filed: Jan. 7, 1993

[51] Int. Cl.⁶ .................................................. G08B 21/00
[52] U.S. Cl. ........................ 340/635; 340/653; 324/555; 324/556; 116/208; 116/216
[58] Field of Search .................................. 340/635, 653; 324/555, 556; 116/276, 207, 209, 211, 216, 217, 219, 221

[56] References Cited

U.S. PATENT DOCUMENTS

| | | | |
|---|---|---|---|
| 3,396,335 | 8/1968 | Burr | 324/537 |
| 4,142,151 | 2/1979 | Hansen | 324/767 |
| 4,170,190 | 10/1979 | Werner | 116/206 |
| 4,296,398 | 10/1981 | McGalliard | 337/297 |
| 4,376,927 | 3/1983 | McGalliard | 337/297 |
| 4,394,639 | 7/1983 | McGalliard | 337/292 |
| 4,469,452 | 9/1984 | Sharpless et al. | 116/207 |
| 4,788,446 | 11/1988 | Sterler | 340/438 |
| 4,835,475 | 5/1989 | Hanakura | 324/435 |
| 4,835,476 | 5/1989 | Kurosawa | 324/435 |
| 5,070,301 | 12/1991 | Schweitzer et al. | 324/556 |
| 5,076,197 | 12/1991 | Darringer et al. | 116/221 |
| 5,313,701 | 5/1994 | Klinger et al. | 324/555 |
| 5,359,319 | 10/1994 | Campbell et al. | 340/649 |

OTHER PUBLICATIONS

"Breakthrough in LCD Technology–Film may be Used to Determine Voltage" pp. 14–15 of National Engineering, Mar. 1987.

*Primary Examiner*—Jeff Hofsass
*Assistant Examiner*—Edward Lefkowitz
*Attorney, Agent, or Firm*—Bruce Lilling

[57] ABSTRACT

An electronic component failure indicator for clearly visably indicating on the surface of an electronic component to be tested a self sustaining indication of the functional operational status of the component. It is used for easily locating and identifying the exact used electronic component that has failed while it is still in a circuit and also later after it is removed from a circuit without the need of test equipment and electrical power. It includes an electronic testing circuit which continually monitors one or more parameters of the electronic component other than temperature. Upon a determination that one or more parameters has deviated from a normal condition, the test circuit generates an appropriate signal. This in turn causes a visable change in an indicator that is visable on the surface of the electronic component being monitored. In some embodiments, this may constitute a color change of the indicator, and in other embodiments, it may cause a bending or movement of the indicator. In the preferred embodiment, the generation of a signal by the test circuit causes current to flow through a wire heating means that heats a thermo-sensitive material, thereby changing the color of the thermo-sensitive material. This thermo-sensitive material is positioned so as to be visible on the surface of the electronic component. By examining the surface of the electronic component and in particular the visable change indicator, a person can determine whether or not the electronic component has failed.

47 Claims, 27 Drawing Sheets

NO DATA INPUT
TRANSISTOR Q7 BAD
TEST RS232 CABLE

PIN 9 SHORTED
CHECK IC M555
REPLACE BAD ROM 6

ELECTROSTATIC EVENT
12/21/1999  12:02 PM
THROUGH PINS 5,7, & 9

LOGIC GATES 1,2,& 9
ARE BURNED OUT
OVERVOLTAGE INPUT

ELECTROMAGNETIC
PULSE 08/99 09:01AM
CIRCUIT DESTROYED

MICROPROCESSOR
BLOWN, NO OUTPUT
SHORT ON PINS 7 & 12

FIGURES 13a-j

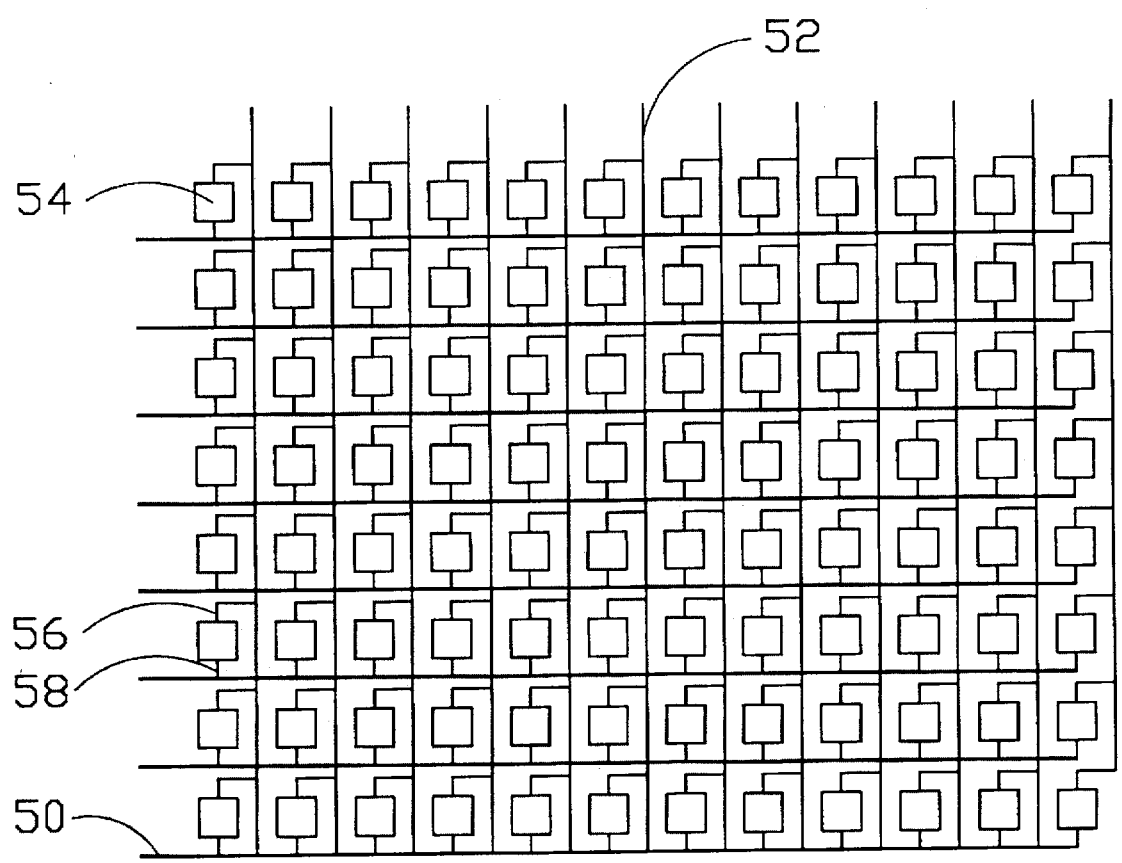

ELECTRONIC COMPONENT FAILURE INDICATOR

FIELD OF THE INVENTION

The invention relates to the electronics industry and, more particularly, it relates to an indicator for identifying an electronic component that has failed in some fashion, and which can be built into and made a part of the electronic component.

BACKGROUND OF THE INVENTION

For a variety of reasons, electronic components have only a finite useful life. At a certain point, these electronic components begin to function intermittently or function poorly or stop functioning altogether. One of the difficulties that arises when an electronic component begins to fail, or completely fails, is the proper identification of the failed electronic component within a device that may contain a myriad number of such similar and other electronic components.

It is not always possible to visually determine whether or not an electronic component has failed. To the extent that an electronic component has burned out, there may still be a lingering odor, or a visibly melted component, but this too may not happen with sufficient frequency to be useful in detecting the failed electronic component. More typically, a failed electronic component could be identified by using a logic probe, multi-meter, oscilloscope, computer, signature and logic analyzer, automatic test equipment, or other test equipment, conducting circuit tests, or replacing electronic components until the failed electronic component is identified.

The problem with these various procedures is that they are all time consuming, tedious, and in some cases costly. It is inefficient to replace electronic components until the failed component is identified. Further, it is quite time consuming, complicated, tedious, and expensive to have a technician conduct a variety of circuit tests on all of the electronic components until the failed component is identified.

Self-testing, self-diagnostic segments of integrated circuits exist which can communicate to external circuit testers and external indicator lights and displays that a fault, error, or failure exists within that integrated circuit or microprocessor. These devices suffer from the fact that the failure indicator is not wholly resident within the integrated circuit and they depend upon external power. In particular, they must communicate with external circuit testers and external indicator lights and displays to indicate that a fault, error, or failure exists. Thus, it is not a substitute for a device that is wholly resident within the integrated circuit and which can provide the self-testing and the self-diagnostic operations, internal power and also have a permanent indicator or display on its surface.

The self-diagnostic devices in the prior art may have two parallel digital systems existing within one integrated circuit. One system is the integrated circuit's actual functional system and the second system is a monitoring system which constantly samples parameters of the other system and checks to determine whether it is working properly. It is used to detect errors, faults, failures, and other abnormal conditions.

In the prior art, there are also built in integrated circuit hardware self-diagnostic memory structures which automatically test each memory location each time each location is used. Such automatic error detection devices increase the cost of the unit, but increase the reliability of the device and decrease the trouble shooting time and cost. Self-trouble shooting, self-healing, self-correcting, self-repairing integrated circuits may test themselves for errors, faults, or failures and generate correction signals that activate replacement circuits for the purpose of correcting the errors, faults, and failure. This is not a substitute, however, for an indicator that identifies the fact that the unit requires replacement or repair. Thus, you can have the situation where the self-diagnostic unit has generated a signal to switch in a replacement circuit, but there is no indication to the user of the product that the redundant portion of the initial integrated circuit has failed and requires replacement or repair.

In systems which use lights and displays to indicate problems or failures of systems, circuit boards, and electronic components, continuous power is required to energize them. If they contain batteries, the batteries have a limited life and must be regularly replaced. Thus, in these systems, the indication of a failure lasts for only as long as the life of the battery. Further, if there is a more permanent power supply, but there is an interruption of the power supply, the indicator will no longer indicate that there is a failure.

It is known in the art to use automatic test equipment to test or monitor every parameter of electronic components, circuits, and systems. Such automatic test instrumentation display and printout the exact nature of the electronic problems and the location of all errors, faults, failures, and abnormal conditions in the components and also in systems containing many components. Through the means of such displays and printouts, it is possible to identify the faulty components. The problem with such systems is that, although they can signal an indicator light to be activated near or next to a failed component, they cannot permanently mark the component as faulty nor can they indicate on the component the nature of the problem. Further, the indicator light must be placed close to the failed component in order to easily know which component has failed.

Sterler (U.S. Pat. No. 4,788,446) discloses a monitoring circuit for an electronic module. It includes an external light 30 which is illuminated when the electronic module 10 is inoperative. An appropriate power supply is used. There are three disadvantages to this device. The first is that the external light will remain illuminated only for as long as power is provided by a power source. If there is a discontinuance of power, then the light would no longer be illuminated and there would no longer be an indication that the electronic module is inoperative. The second problem is the lamp must be placed close to the module in order to know which module has failed.

The other problem is that the Sterler device cannot be made sufficiently small, as to be inserted in a small electronic component, such as an integrated circuit, a surface mounted component or LED. Further, if the Sterler device were miniaturized, it would require a constant power source, such as a battery, to keep the light illuminated for a sufficient period of time. The battery life would decay while it waited to be used and, when it was used, it would have only a finite life. If some other more permanent power source was used, the device would suffer from the fact that an interruption in the power supply would prevent the illumination of the indicator device. Thus, this device would not be suitable for such small electronic components. Another point is that the Sterler device shows an external light which is not made integral with the electronic component. Thus, it suffers from the disadvantage of not being sufficiently compact and it cannot be used as a device embedded within the electronic component.

The Zerostat ESD detector module detects electrostatic discharge (ESD) events, but it does not monitor itself or another circuit for a definite failure, error, or improper operation of an electronic component. It can only signal or display that an ESD event has taken place. It indicates an ESD event via a liquid crystal display (LCD) and uses a rechargeable battery to continuously power the LCD and the electrostatic event detector circuit in an electronic module to detect transient voltages. It costs a great deal of money and it suffers from the same deficiencies as does the Sterler device. Its life for detecting and displaying static electricity event is three years, but standard electronic components may be used for many years more than that. It too does not permanently mark a component suspected of failure.

When electronic components become too hot, they may often fail. Heat sensitive materials, such as heat sensitive paint, thermo-sensitive chemicals or heat sensitive ink have been used to mark components on circuit boards for many years and are sold by such companies as Tempil Corporation and Omega Engineering. Such heat sensitive materials have generally been used to indicate electronic components which have become overheated during operation. These heat sensitive materials have been painted or coated on the surfaces of the electronic components, and serve as indicators when such components become too hot or are overheated. Some adhesive back temperature sensitive labels and temperature indicating paints can actually indicate the exact temperature when they change color. Resistors, fuses, power diodes, transistors, SCRs and rectifiers, as well as integrated circuits, have been painted or coated with heat sensitive material by users of the Tempil or Omega products in order to indicate whether they have become overheated or burned out, and also determine at what temperature they began to fail. Heat conduction to the temperature sensitive material through the component casing is not always efficient, and sometimes there is not enough heat being passed through to the temperature sensitive material to change its color despite the component failure. Besides, such heat sensitive materials would not be effective to identify a failed component when the component has failed for reasons other than overheating.

McGalliard (U.S. Pat. Nos. 4,296,398; 4,376,927; and 4,394,639) uses thin films of heat sensitive material on printed circuit board fuses. This helps to more clearly indicate which printed fuses have blown on that particular circuit board. In particular, according to the McGalliard inventions, current passes through the neck of the printed fuse elements. If the current raises above the rated value of the fuse element, the heat generated causes the neck to burn out or vaporize, thereby breaking the circuit. To prevent the possibility of metal particles being freed during melting of the neck section and being deposited at undesirable locations on the printed circuit board, the neck section of the each printed fuse element is preferably provided with a small covering of dielectric or other suitable material. McGalliard then suggests that in some situations the dielectric material may be coated with a temperature sensitive film, which changes color permanently in response to extreme temperature increases. Thus, upon burnout of the neck of the fuse element, the change in color of this material may indicate the location of the failed printed circuit fuse to the service technician. The problem with this type of device is that it works only when the device itself (the fuse) overheats. It is not a useful detection device for devices which may fail for reasons other than by overheating due to excessive draw of current.

Burr (U.S. Pat. No. 3,396,335) discloses a similar method

According to the Burr patent, operationally defective conductors have local areas of higher impedance which cause increased local temperature rises during current flow through the sections. The patent then discloses that such local temperature rises can be detected by maintaining a heat sensitive sheet, which changes color in local areas in response to a local temperature rise, in intimate contact with the printed circuit conductors. The distinction here is that this method will again work only in connection with printed circuit conductors that have failed due to overheating. Failures in components or in conductors caused by any other means would not be detected by this expedient.

Hanson (U.S. Pat. No. 4,142,151) discloses a device for identifying that one of the diodes or capacitors in an array of diodes and capacitors has shorted, but it does not identify which diode or capacitor has failed. The failed diode or capacitor is not marked—only the array as a whole is marked; and, therefore, each diode and capacitor must be individually checked to determine which one has failed. A resistor with a wax paper coating is connected between normally equipotential points intermediate two diodes of adjacent pairs of branch circuits. When the current is shunted through the resistor with the wax paper coating, due to the failure of one of the capacitors or one of the diodes, it causes melting of the wax paper coating on the resistor to indicate that somewhere—without identifying where—in the array there is a failure. Further, the Hanson indicator is not embedded within the electronic component (the diode itself or capacitor itself), thereby making detection of the failed component somewhat difficult. Anyone noticing the melted wax of the resistor in the Hanson device will know that there has been a failure somewhere in the array, but will not be able to easily determine which one of the four capacitors or which one of the four diodes has failed without testing each diode and each capacitor of the array. Thus, this device suggested by Hanson is not helpful for identifying the particular failed electronic component. If the failed capacitor or diode is found and removed from the array, it still has no permanent marking that it has failed. Therefore, it could accidently be used again in another circuit. Moreover, the Hanson device is not useful in enabling automatic test equipment to identify an individual faulty diode and marking the failed diode itself with an indicating mark.

Hanakura (U.S. Pat. No. 4,835,475) discloses the use of thermochromic materials, but only in the context of a battery strength tester. He does not disclose or suggest the use of such thermochromic materials for identifying a failed component. Similarly, while Kurosawa (U.S. Pat. No. 4,835,476) discloses the use of temperature sensitive decoloring type coloring layers, it is used for measuring the level of voltages in a battery strength indicator. He too does not disclose or suggest the use of such materials for indicating the failure of an electronic component.

In the above described devices and other similar devices in the prior art, a continuous source of power is required to continue to power an indicator, or the indicator is not embedded in the electronic component being tested, or the failed component is not permanently marked as being defective.

Thus, this invention is designed to correct these three deficiencies of the prior art. The instant invention provides a device which does not require a continuous source of power and it provides a permanent indicator that can be embedded directly into the electronic component. Further, it can even indicate what is wrong with the component by a visual inspection of the indicator on the component even

SUMMARY OF THE INVENTION

Therefore, it is a primary purpose of this invention to provide a simple-to-use and inexpensive failure indicator that can be built into and be arranged so as to be visible on the surface of an electronic component. It will thus immediately and easily identify a component that has failed, and in some cases indicate what is the nature of the failure. This will facilitate the location and identification of such failed components and will make it possible to more quickly replace them with properly functioning components.

Another purpose of the invention is to provide a failure indicator that will continue to indicate and identify the failure of an electronic component, even after the flow of power has being discontinued and after the component is removed from the circuit. More particularly, the failure indicator of this invention is activated by a single pulse of power and it will thereafter continue to indicate that there has been a failure, even if there are no further pulses of power and all sources of power are discontinued or fail.

It is the purpose of this invention to make a fast, permanent, and irreversible electro-chemical, electro-mechanical, or electro-optical change to an indicator built into and visible on the surface of an electronic component. This change in the indicator is triggered by a pulse from an embedded self-test or self-diagnostic circuit. This is done whenever the electronic component has become defective or has failed in some manner. This also facilitates the basic purpose of this invention to make available the easy and quick identification of defective and damaged electronic components in circuit boards and other electronic apparatus.

Further, this makes it possible to trigger a failure indicator visible on the surface of the electronic component without the need for extensive and complicated testing procedures or the use of testing equipment. In the preferred embodiment, the indicator will change from one color to another upon receiving even a momentary pulse from the embedded self-test circuitry. In other embodiments, instead of changing from one color to another, the momentary pulse will cause the indicator to visibly bend or change position, so as to similarly indicate a failure in the electronic component.

In all embodiments of the invention, the component failure indicator may be built into the electronic component, but has the indicator portion visible on the surface of the electronic component. Testing circuitry of appropriate type is used to constantly or periodically monitor the parameters of the electronic component. Upon detection of a failure or other deviation from stated conditions, at least a momentary pulse is generated which activates the indicator. In some embodiments, this causes a change in color in the indicator and in other embodiments it involves a physical bending or movement of the indicator. In either case, the indicator will have changed in some fashion which will be visible on the surface of the defective electronic component, so as to easily mark the fact that there has been a failure in some fashion of the electronic component.

The electronic component failure indicator of the preferred embodiment of this invention includes a testing circuit, a power source, a thin wire filament and a thermo-sensitive material. More particularly, the testing circuit will be monitoring certain parameters of the electronic component. When there is a detected fault, error or failure, it generates a pulse. This will cause current to flow through the wire filament, thereby causing it to be heated. When there is a detected fault, error or failure, the heating of the wire filament in close proximity to the thermo-sensitive material causes the thermo-sensitive material to change color in a rapid fashion. By examining the thermo-sensitive material, which is positioned to be visible on the surface of the electronic component, the user can immediately and easily determine exactly which electronic component has failed.

Because thermo-sensitive materials are being used, once a single momentary pulse of power heats the filament to cause a change in the color of the thermo-sensitive material, no additional power or heating is required. Thus, the color change of the thermo-sensitive material will continue indefinitely to provide an indication that there has been a failure, even though the filament is no longer heated and the power source is no longer providing any power to the device.

In other embodiments of the invention, the electronic component failure indicator includes a testing circuit, a power source and either a bimetallic strip or a Nitinol wire. As in the other embodiments, all of these elements could be embedded within the electronic component and the bimetallic strip (or Nitinol wire) would be visible on the surface of the electronic component. In the case of a failure or a deviation from stated conditions, the test circuit would generate an appropriate electronic pulse, which need only be momentary. In the case of the bimetallic strip this will cause it to bend and change position, thereby indicating that there has been a failure. In the case of a Nitinol wire, this wire would bend back to its original or memory position, also thereby indicating that there has been a failure.

The invention also contemplates other types of indicators which may undergo a visible change upon the generation of even a momentary pulse from the internal testing circuitry.

Thus, the invention contemplates a wholly self-contained failure indicator which is built into and embedded within the electronic component, and which includes an indicator which is visible on the surface of the electronic component. Upon generation of even a momentary pulse by the internally embedded testing circuitry, some visible change is effected by the pulse on the indicator. As the visible change in the indicator is visible on the surface of the electronic component and is permanent and irreversible, it immediately provides a permanent indication that the component has failed.

BRIEF DESCRIPTION OF THE DRAWINGS

FIG. 13 shows top plan views of several different integrated circuit packages

FIG. 14 is a top view of an alternate embodiment of the invention, showing individual resistor film elements connected to wires comprising an alphanumeric display matrix array of the resistive film elements to be covered by thermofax paper.

DETAILED DESCRIPTION OF THE INVENTION

The basic invention consists of a testing circuitry, a power source and an indicator. The testing circuitry continually, or periodically, monitors one or more parameters of the electronic component and generates a signal when there is a failure or a deviation from certain stated conditions. The power source is required to generate at least a momentary pulse upon the reception of the error signal from the testing device. The momentary pulse from the power source is then communicated to and activates the indicator. The indicator is designed so that it will undergo some visible change upon receiving the momentary pulse. As the indicator is visible on the surface of the electronic component, there will be a visible indication on the surface of the electronic component that there has been a failure or deviation from stated conditions. Further, the indicator is constructed so that the visible change effected by the momentary pulse will be permanent and irreversible. Thus, a discontinuance of the power supply or a failure to generate additional pulses will not cause the indicator to discontinue indicating the failure of the electronic component.

One aspect of the invention is that it provides for a permanent and irreversible visible change in an indicator in the electronic component, which will continue even after the discontinuance of the power supply, or even if the defective component is removed from the circuit. This feature is not known in the prior art. This permanent marking of the component itself is an advantage in the situation where the component may be removed from the circuitry, is factory tested or if the power fails.

Another aspect of the invention is that it provides for a failure indicator for an electronic component that can be completely embedded within the electronic component being monitored and tested for faults. This aspect too is not known in the prior art.

The failure indicator 10 may be built into or used in connection with any type of electronic component. This includes microprocessors, micro-controllers, diodes, operational amplifiers, DACs, SCRs, TRIACs, RAMs, SRAMs, PROMs, EEPROMs, timers, rectifiers, transistors, display drivers, integrated circuits, oscillators, thyristors, FETs, MOSFETs, triggers, capacitors, opto-isolators, transformers, clocks, analog-to-digital and digital-to-analog converters, photocouplers, LEDs, DRAMs, laser diodes, electronic tubes, optical integrated circuits, lasers, fluorescent and incandescent bulbs and any other type of electronic component.

Figure 5:
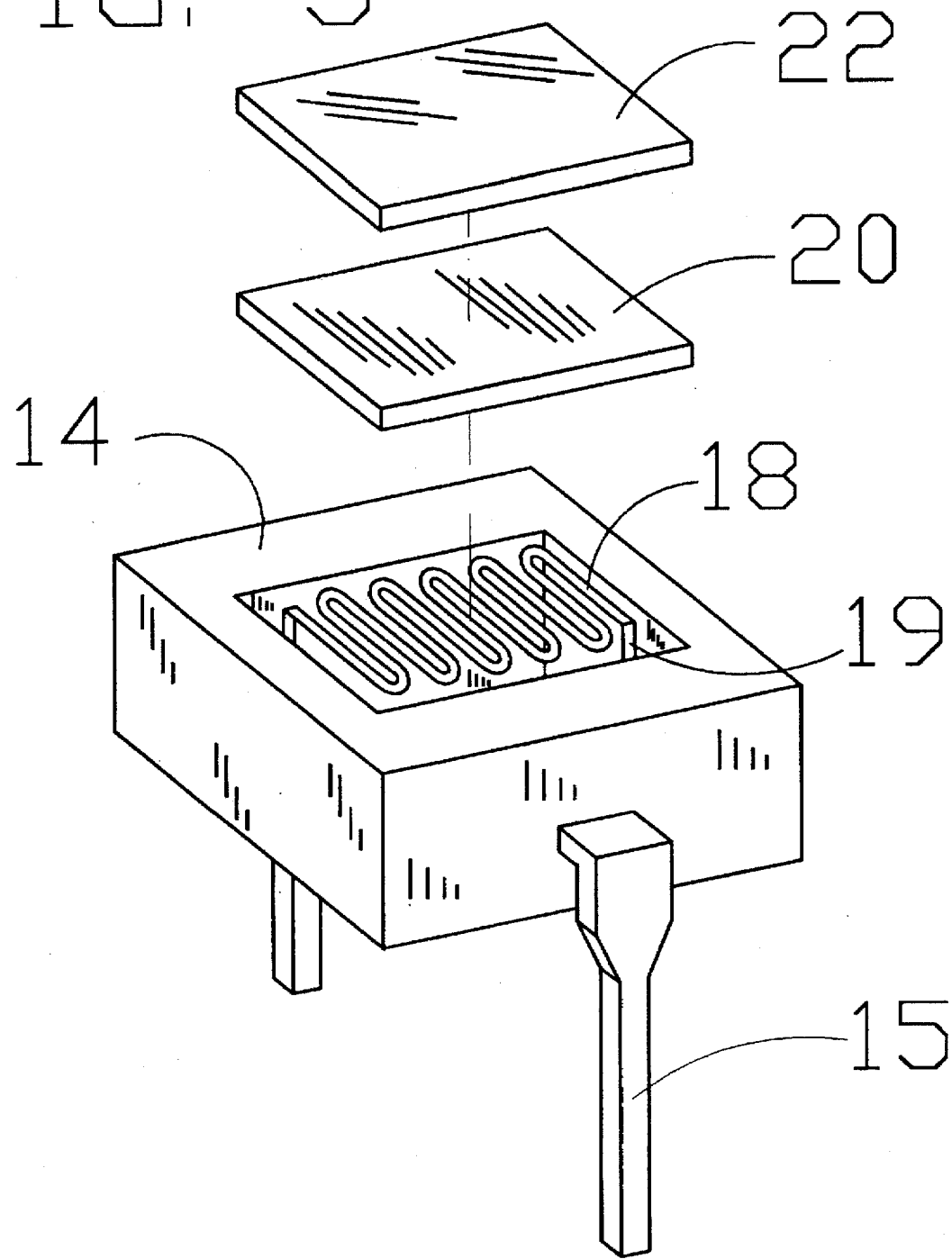
FIG. 5 is an exploded perspective view of an alternate embodiment of the invention, showing a stand alone failure indicator with a wire filament, a thermosensitive material, a housing, a window and leads for mounting the device onto a printed circuit board.

Stand alone failure indicators of the type of this invention may be placed on a printed circuit board to indicate failures in electronic components, circuits and systems which do not themselves contain embedded failure indicators. Stand alone failure indicators may also contain a testing circuit, pulsed power means, conductive connectors and at least one visible change indicator (as shown in FIG. 5).

Figure 6:
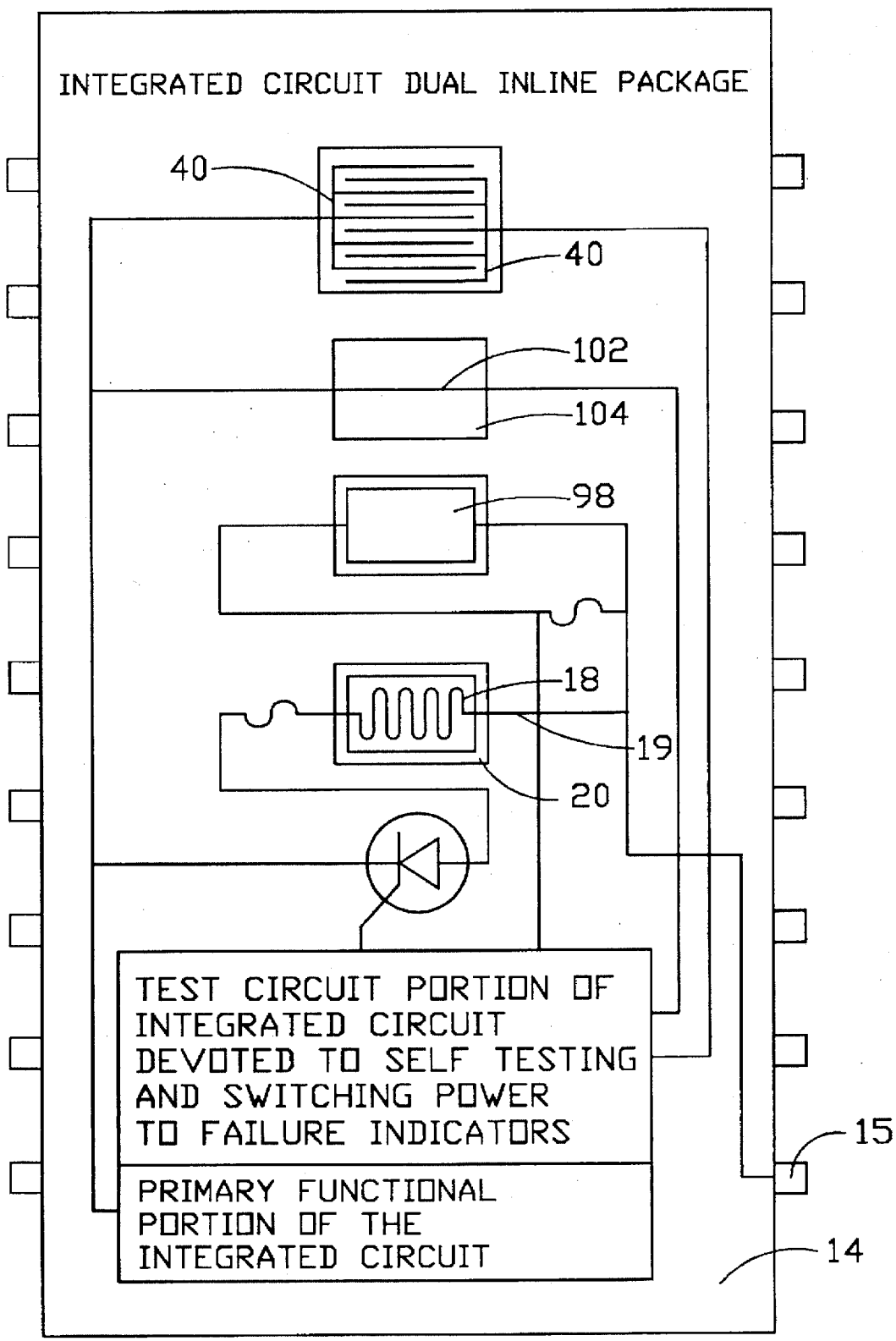
FIG. 6 is a circuit diagram, showing an electronic component with multiple failure indicators, an electrosensitive indicator, a wire fuse indicator, a thin film indicator, thermosensitive indicator, an integrated circuit chip, a test circuit, and an SCR—all built within an integrated circuit package.

In the drawings, the failure indicator is shown built into and used in connection with an integrated circuit package. In some cases, the testing circuit will be located on, and share space with, and be along side of the primary functional portion of the integrated circuit being tested (as shown in FIG. 6).

The failure indicator 10 first includes a testing circuit 12. This is for the purpose of analyzing and monitoring one or more of the parameters of the electronic circuit and generating a signal when there is a failure. The testing circuit can be of any known design and may monitor any one or more of the different parameters of the electronic component. In the preferred embodiment, the testing circuit is embedded within the electronic component, but in some embodiments it may be desirable for the testing circuit to be external to the electronic component being monitored, tested and diagnosed. When the testing circuit is external to the tested component, it is either on a circuit of a device being used which contains the component or in external test equipment.

Further, in some embodiments, it may be desirable to have multiple failure indicators on the same electronic component (see FIG. 13). Each failure indicator would have a thermosensitive material of a different color and each of the respective test circuits would be connected to a different parameter. Alternatively, the failure indicators may change in different manners, such as bending to different positions in the case of electro-mechanical bending of bimetallic strips. In this way, by determining which of the failure indicators has been activated, it can be determined as to which parameter of the electronic component has deviated from its normal condition. For example, one failure indicator may be connected to the input, another might be connected to the output, another failure indicator may be connected to one of the components within the electronic component, and so on. In this way, not only will the failure indicator identify the fact that the electronic component has failed, but it will also identify which part of the electronic component has failed. Thus, to the extent that the electronic component can be reused by reconnecting unused or undamaged circuits, as opposed to discarding, the electronic component can be reused. For example, in a quad operational amplifier, if indicators show that two of the operational amplifiers have failed, the other two can still be used.

Figure 1:
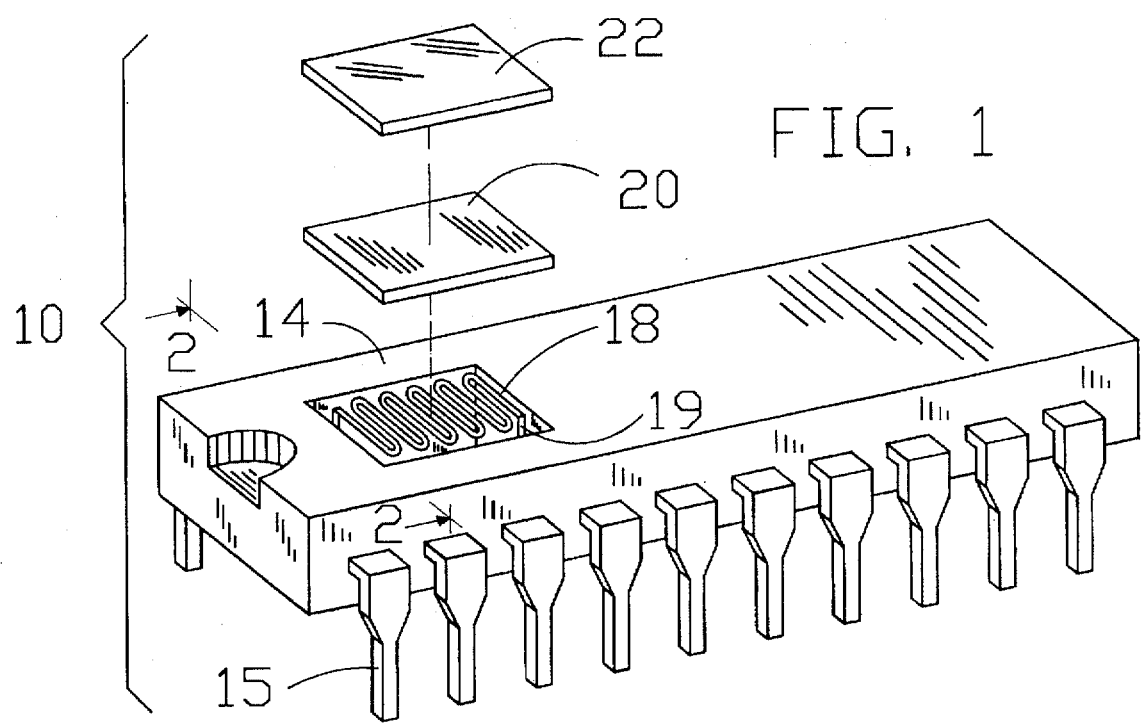
FIG. 1 is an exploded perspective view of the invention, showing the electronic component, the wire filament, the thermo-sensitive material and a transparent window.
Figure 2:
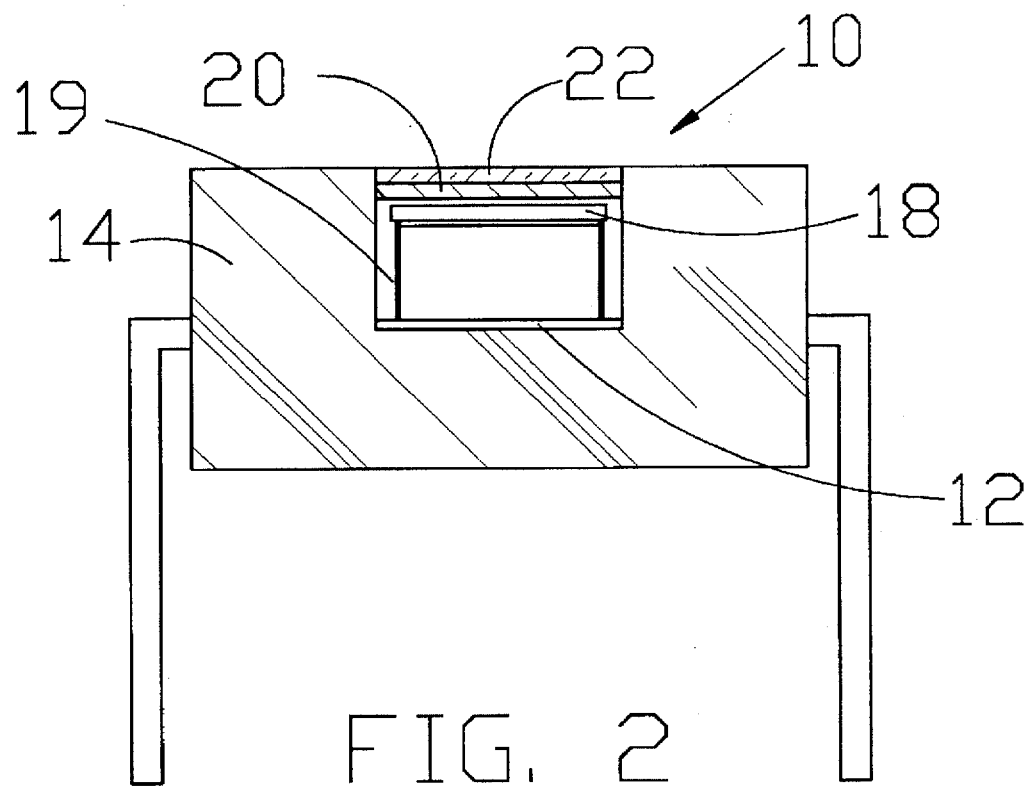
FIG. 2 is a cross-sectional view taken along the line 2—2 of FIG. 1.
Figure 3:
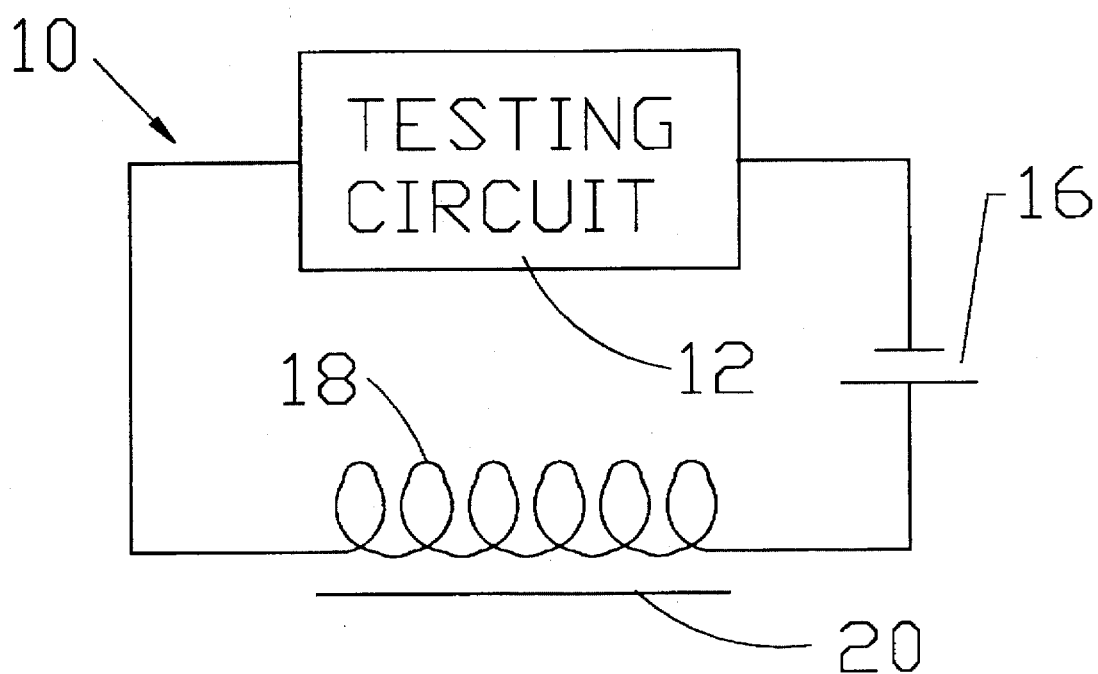
FIG. 3 is an electrical schematic drawing of the circuitry of the failure indicator show in FIG. 1.

The testing circuit 12 may be embedded within the electronic component 14, as best shown in FIGS. 1 and 2.

A thermo-sensitive material 20 is positioned within the electronic component, so that it will be visible along one of the surfaces of the electronic component. In some embodiments, it may be desirable to place a transparent or translucent material or coating (window) 22 on the surface of the electronic component 14 and over the thermosensitive material 20 in order to protect the thermosensitive material from damage. The window may be a coating, glass, mica, plastic or any other suitable material.

The thermo-sensitive material is, in particular, a material that will change quickly from one color to another when heated. In the preferred embodiments, thermo-fax paper, heat sensitive chemicals, heat sensitive paint, thermochromic materials and heat reactive optical materials may be used. The thermo-sensitive material 20 may be a thin layer of paper, such as thermo-fax paper, or it may be a thin layer of material, such as heat sensitive paint or thermochromic film. The heat sensitive material may even be a solid material which will easily melt and change its visual appearance, texture or color. In some cases it may even be desirable for the material to burn or char upon receiving a momentary pulse and thus indicate a failure. The particular material selected will be dependent upon in which electronic component the failure indicator is being used.

In close proximity to the thermo-sensitive material, a wire filament 18 is positioned. The wire filament would be an ultra-thin wire which will quickly heat upon the flow of current through it. In some cases, the heating element may be made an electroconductive film, a straight wire, or made in a coil, zig-zag, printed circuit design or in some other suitable configuration. The heating wire filament resistive element may be a printed circuit heater element printed on a insulator with an electroconductive film or a metal layer. It may also be in a printed layer of resistive film on an insulator. In all cases, the heated device is in close juxtaposition to the heat sensitive color changing material and both may be embedded within the electronic component. The wire may be of any material that will permit the flow of current and will heat in a sufficient manner to transform the color of the thermo-sensitive material.

The test circuit 12 and the filament 18 are connected in series with a power means 16. The power means may consist of a simple battery, generally of about 1½ volts, or a DC power supply rectifying AC, or it could be AC. It is only necessary for the power means to provide at minimum a single momentary pulse. According to this invention, upon receiving a continuous current or even a single momentary pulse, the indicator will undergo a visible change. Thereafter, no further power or pulse is required, as the visible change in the indicator is permanent and irreversible.

In operation, the testing circuit 12 would be constantly, or in some cases periodically, monitoring one or more of the parameters of the electronic component. When a failure, or possibly only a predetermined deviation from a stated operation or condition, has occurred, it will generate a pulse and current will begin to flow in the series circuit that consists of the test circuit, the power means and the filament. This will cause the filament to be heated, thereby heating the thermosensitive material and causing the thermo-sensitive material to change colors. As the change in color of the thermosensitive material would be visible by inspecting the surface of the electronic component, it will be easy to determine that the electronic component has failed.

It may be appreciated that the power circuit needs to provide only a single pulse of short duration to the filament. Even with a battery or power source of one and a half volts, in less than a second, sufficient current will flow through the filament to heat the filament and cause the change in color of the thermo-sensitive material. Thereafter, even if the flow of current continues and the filament continues to heat the thermo-sensitive material, there will not be any additional change in the coloration of the thermo-sensitive material. In some circuits it may, therefore, be desirable to create a power circuit that creates a single momentary pulse of a duration sufficient for the filament to be heated and the thermo-sensitive material to change color. Alternatively, in some embodiments, a timer circuit may be used to discontinue the power circuit after the indicator has undergone a visible change. In other embodiments, a fuse may be used to disconnect the power circuit after the visible change in the indicator.

Figure 4:
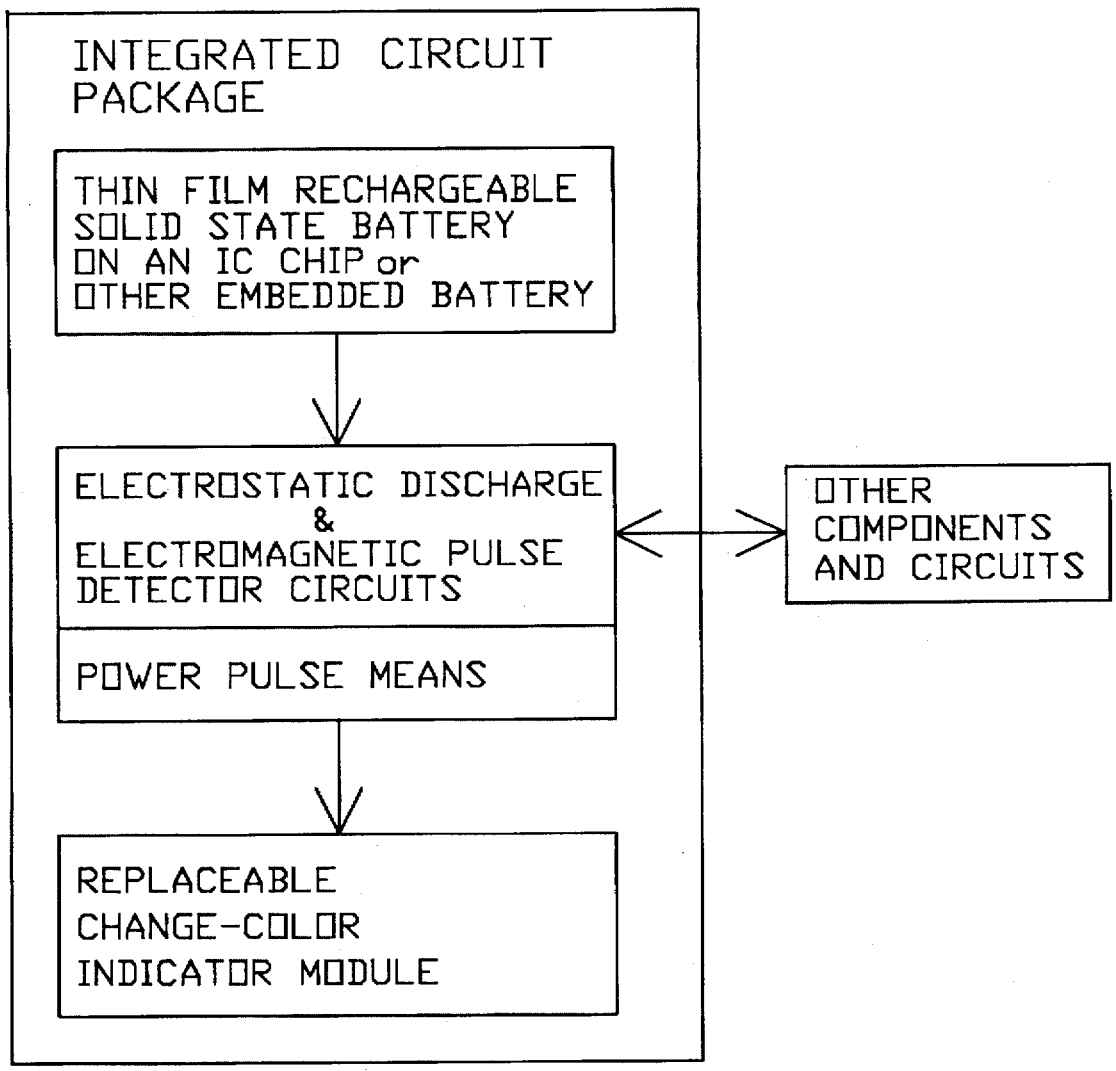
FIG. 4 is a functional block diagram showing an electro static discharge and electro-magnetic pulse detector integrated circuit, embedded thin film solid state battery on a chip, and a replaceable color change indicator module.

In the preferred embodiment of the invention, the power pulse means or power supply may be external to the electronic component itself. In still other embodiments of the invention, the power supply, such as an embedded rechargeable battery, may be embedded within the component. The power supply may be comprised of thin film layers of chemicals deposited on the integrated circuit self-diagnostic chip itself, thus comprising a rechargeable or non-rechargeable battery. This battery whether on an integrated circuit chip or just an embedded miniature battery would have its power controlled by the integrated circuit or other embedded circuit. If the battery is a thin film solid state or chemical rechargeable battery on a chip, it would power the integrated circuit chip which would then apportion its power to such devices as an (ESD) electrostatic discharge event monitor circuit, a self-diagnostic monitor circuit, power pulse generation circuit to a failure indicator, external (EMP) electromagnetic pulse monitor circuit, external component or circuit monitoring circuits, or to the circuits which provide the actual functioning of the electronic device (see FIG. 4). Therefore, depending on the embodiment, the power supply may either be external to or internally embedded within the electronic component.

The color of thermo-fax paper changes rapidly from white to black when heated. A 1½ volt current through a fine wire filament pressed against such thermo-fax paper rapidly changes the color of the area in contact with the wire. In some embodiments, a small brightly colored geometric shape, for example, a yellow outline of a square or circle, would be the visible border of a window under which would be the thermo-fax paper or thermosensitive paint and a fine wire filament. These would all be contained within and placed at the surface of an electronic component.

The invention will also work when the chemicals in thermo-fax paper are coated on a transparent window which is pressed against the wire filament.

The wire filament is connected to the self-test circuit and receives a pulse or continuous current upon the generation of a signal that there has been a failure or some other deviation from stated conditions in the electronic component. This causes the wire filament to heat and thereby changes the color of the thermo-fax paper used as the indicator. When a brightly colored square border is used on the thermo-fax paper, or a brightly colored border surrounding the window hole covering the thermo-fax paper is used, a person need only look to see whether the inner color has changed in order to determine whether there has been a failure.

This invention thus provides two advantages, which are not available in the industry. The first is the ability to provide a failure indicator on small electronic components, and the second is the provision of a failure indicator which will continue to indicate and identify that a component has failed even after the flow of power has been discontinued, or even after the component is removed from the circuit. These advantages and features are not currently available and provide very important and beneficial results to the industry.

Hereinafter presented are various examples of particular applications and usages of the invention. From this, it will be seen how the invention can be most efficiently utilized.

If power is applied to an electronic device and if there is a detection by the test circuit that power has not energized an element of that device, then a separate circuit containing a logic gate will activate an electronic component (such as, an SCR, transistor, or integrated circuit), which will energize a visible indication of a fault in that electronic component on the surface of that electronic component. The failure indicator may occupy only a small segment of the electronic component and may appear as a small square or circle on its surface.

In an integrated circuit which has a logical input and should then have a logical output, but no logical output is detected, a logic gate may turn on an electronic component which will energize a visible indication of the fault in that integrated circuit on the surface of the integrated circuit. If the integrated circuit should have a particular logical output, but does not, a logic output detector coupled to the particular output pin of the integrated circuit can trigger the visible indicator.

In another example where an integrated circuit is energized with power and should be producing oscillations, but is not producing oscillations, then an oscillation detector may trigger a device within the integrated circuit which will activate a circuit which will produce a permanent indication of the fault in that integrated circuit on the surface of the integrated circuit. The oscillation detector may include a counting circuit which is reset by an oscillating circuit. If a repetitive polarity change of the oscillating circuit does not reset the counting circuit every few time periods, then the counting circuit will count to a specified number and generate an output voltage which will activate the electronic component to turn on the visible indicator circuit, thereby indicating a failure.

If an integrated circuit is powered and is supposed to produce a particular output waveform, or have a particular frequency and if it does not produce the correct waveform or frequency at its output, then a circuit that compares a reference waveform with the output waveform or compares a reference frequency with the output frequency, can trigger or generate a visible indicator when the wrong frequency or waveform is being generated.

In other situations where power is transmitted to the integrated circuit, and there should be an output of a voltage or current at a particular level, and there is no such output, then an output detector may trigger an electronic device to produce a permanent visible indication of a fault in that integrated circuit on the surface of the integrated circuit. To accomplish this, the output detector may include an invertor, an AND gate, and an SCR. If there were power to the integrated circuit and to one input of the AND gate, and if the test point output went to the invertor and then to the other input of the AND gate, but there was no output voltage at the test point, then the logic gate would output a voltage which would turn on the electronic component to trigger the visible indicator circuit, thereby making a visible indication on the surface of the integrated circuit that there is a failure to produce an output at the particular test point.

In still other integrated circuits to which power is applied, and particular points within the integrated circuit do not have the correct current ratio or voltage ratio, then a circuit, which compares the ratio value of the reference voltage or current with the tested voltage or current, can output a signal which will trigger the visible indicator circuit. Such a voltage ratio comparitor circuit or current ratio comparitor circuit may be comprised of a summing operational amplifier and logic gates. The output currents or voltages from the test points of the integrated circuit will be fed into the summing operational amplifier. If the summing amplifier is calibrated to output a zero at a proper voltage or current ratio, then, if the variance is anything other than zero (either positive or negative), the detector circuit will trigger the visible indicator, thereby creating an indication on the surface of the integrated circuit that there is an incorrect current ratio or voltage ratio.

Some electronic components will use an internal built in fuse, which will blow when there is too much current or voltage. This can be coupled with a visible indicator in parallel with the fuse, which will be activated when the fuse blows, thereby indicating a failure of the electronic component. A trigger circuit could alternatively be activated, such as one containing an SCR which will activate the indicator. Over voltage may also be detected by a comparator comparing a monitored sample test voltage to a known reference voltage, which will activate the failure indicator when there is an incorrect voltage.

Transient currents or voltages can also present problems for electronic components. If an integrated circuit receives a transient voltage or current, then the visible indicator can be activated to create an indication on the surface of the integrated circuit. This can be accomplished with operational amplifiers, FETs, transistors, SCR's, flip flops or other electronic components, all of which can be embedded within the electronic component.

Figure 7:
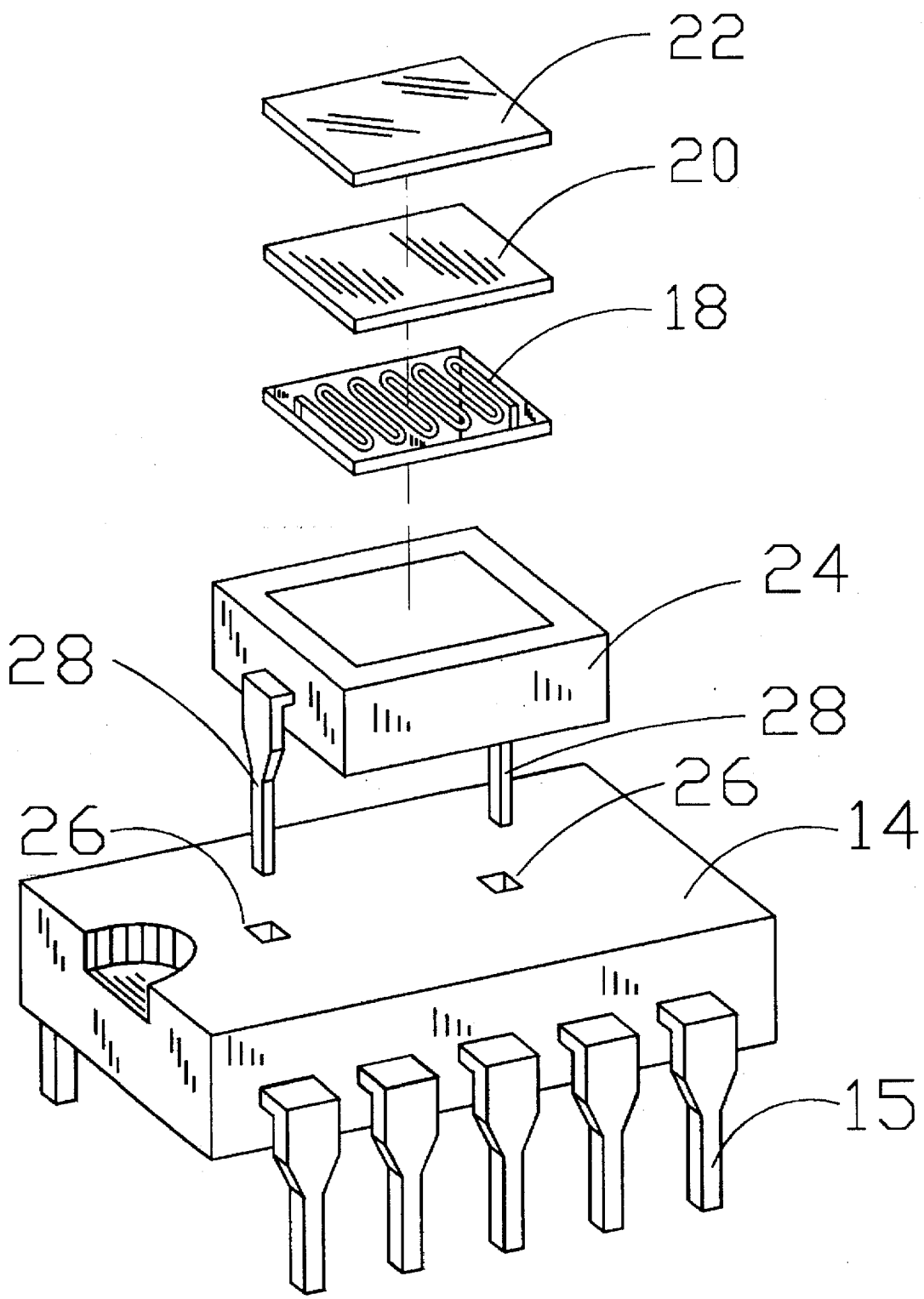
FIG. 7 is an exploded perspective view of an alternate embodiment of the invention, showing a visible change failure indicator comprising a heater filament on a printed circuit board, thermosensitive material, a top transparent cover window, replaceable plug-in module and a dual inline integrated circuit package with built-in pin receptacles to receive the replaceable module's pins.

If an integrated circuit is powered (or in some cases unpowered) and a transient voltage or current passes through a wire (or semi-conductor) of the integrated circuit to which a signal detector is connected, which will sense transient voltage, or electrostatic discharge of transient current above a stated value, then the signal detector will activate an electronic component (such as a flip flop, transistor, SCR other device) which will trigger a visible indicator on the surface of the integrated circuit. This will create a permanent and irreversible change in the visible indicator. When the integrated circuit is powered and an electrostatic discharge above a threshold is received by the integrated circuit, then either an FET or an amplifier with an antenna in the integrated circuit will trigger a flip flop, thereby turning on an indicator circuit which will trigger a visible change fault indicator on the surface of the integrated circuit, thereby showing that a destructive electro static event has occurred. In the situation where the integrated circuit is unpowered, but contains an embedded rechargeable battery, then, when the integrated circuit receives a transient electrostatic discharge, the integrated circuit can generate a permanent and irreversible visible indicator to change visibly on the surface of the integrated circuit. This is accomplished when the electrostatic discharge triggers an FET or amplifier which then triggers an SCR or flip flop which turns on power from the self-contained embedded rechargeable battery to power the visible change of the failure indicator. The rechargeable battery powers the detection circuitry and is recharged when the circuit is powered. Such an integrated circuit, component or stand-alone module might also possess built in receptacles 26 to enable a replacement of a color change indicator module 24 (see FIGS. 7 and 11). This module 24 may be comprised of a printed circuit heater element 18 (or wire filament or conductive film) covered with a thermo sensitive material 20, a transparent covering 22, and two metal pin leads 28. Instead, an unlatchable, resettable micromechanical movement indicator may be used as later described.

When an integrated circuit or microprocessor's supplementary self-test or self-diagnosing circuit generates an output indicative of an error or fault or improper condition, then such an output can trigger a visible indication of the failure on the surface of the integrated circuit or microprocessor. When an integrated circuit is powered and no reaction from a self-test circuit occurs, then this could also trigger a failure indication by means of the output sensor detector which triggers the visible indicator when the circuit is powered and there is no self-test output.

In embodiments where the integrated circuit or microprocessor has self-contained redundant equivalent circuits operating simultaneously, and if some of the outputs of each redundant circuit should be exactly equal in voltage, current, frequency, logic level or resistance, but are not equal, then its test circuit can trigger a permanent visible indicator change on the surface of the electronic component.

When automatic test equipment detects a defective component, it too can trigger a visible change indicator on the surface of the electronic component. Further, when automatic test equipment is testing the operation of any system or electronic component on a computer board or even testing individual electronic components, such as microprocessors or integrated circuits, and, if there is a detection that there is a defective component, then the test equipment can activate the visible change indicator on the appropriate component. As it will be visible on its surface, the component will be immediately visibly marked defective.

In some embodiments of this invention, therefore, wire leads 19 extend from the filament 18 of the failure indicator out to the wire leads or pins of 15 the component 14, so that test circuitry or equipment may signal the failure indicator to change color. Such leads would also exist in some other failure indicator means later described. In other embodiments of the invention, other permanent change color indicators would be used in lieu of the thermosensitive material and wire filament. These other indicator embodiments would be attached to and be energized by the same two wires that would have been attached to and would have heated the filament, except for the following one embodiment which is not electrically energized.

Figure 8:
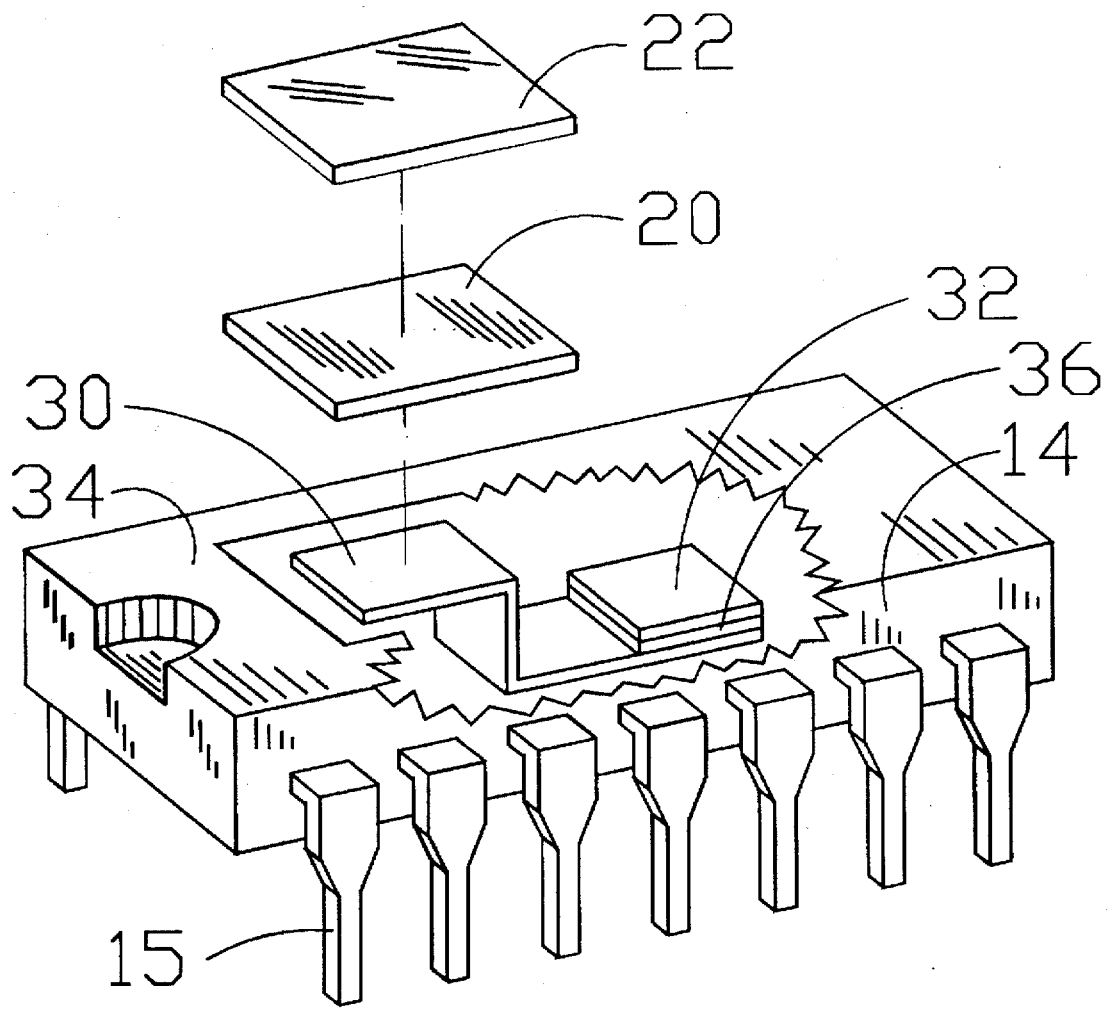
FIG. 8 is an exploded perspective view of an alternate embodiment of the invention, showing a dual inline integrated circuit with an integrated circuit chip on a heat conductive insulator which is on a heat sink which touches thermosensitive material on the surface of the integrated circuit package.

In this embodiment of this invention, a metal heat sink 30 attached to the substrate layer 36 of an integrated circuit chip 32 extends to the top surface 34 of an integrated circuit package 14 and protrudes through the top surface of the integrated circuit package to expose a little circle or square of the heat sink material where a temperature indicating paint is painted, or a piece of thermosensitive material 20 is placed (See FIG. 8). If too much heat is generated by the integrated circuit, thereby causing the heat sink temperature to rise to a temperature above a given threshold, the paint would change its color, thereby indicating that the integrated circuit had become too hot to work properly or reliably and that it should be replaced. A transparent or translucent glass coating or plastic window 22 may cover the temperature indicator paint or chemical. This would be more effective than the common practice of painting with temperature indicating paint integrated circuit plastic cases which do not conduct heat well. A wire filament may be placed between the heat sink and the thermosensitive paint, thus providing a dual failure indicator—one for overheating detection and the other for fault indication.

Figure 9:
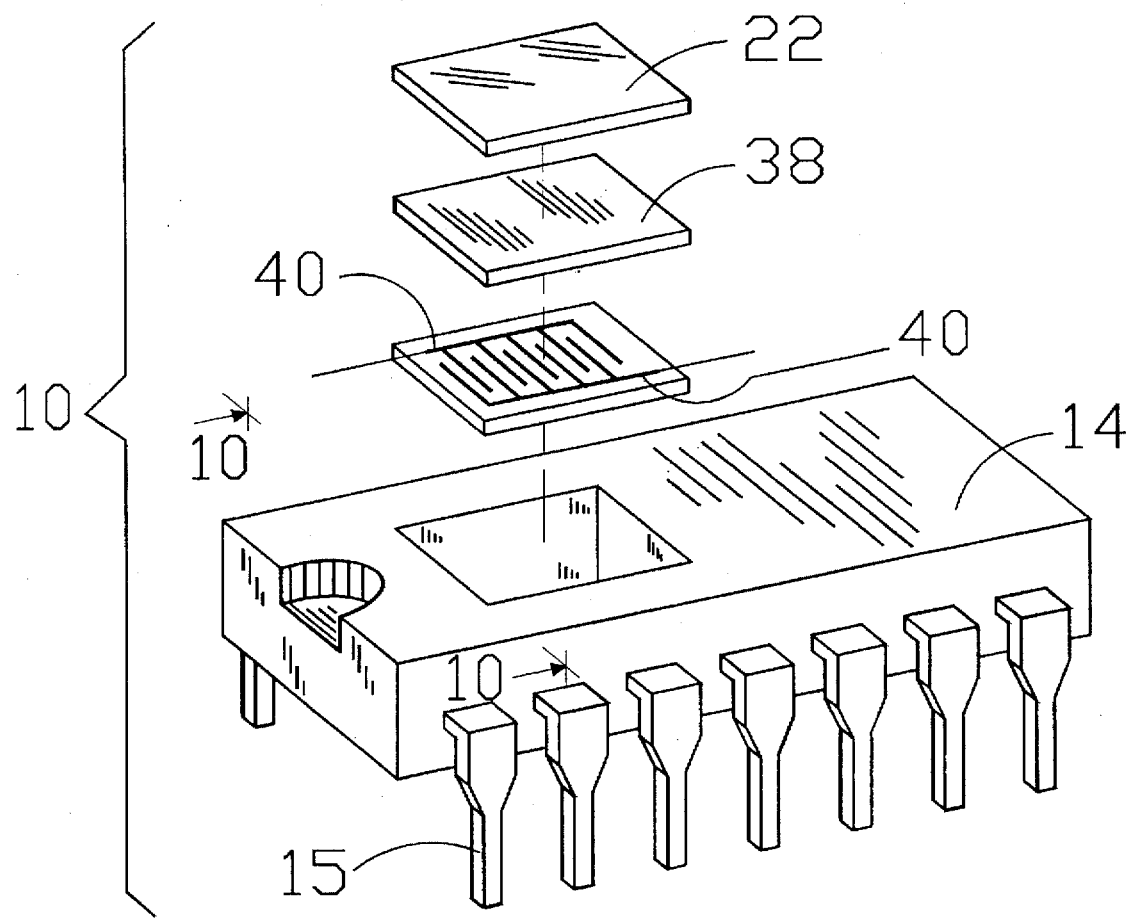
FIG. 9 is an exploded perspective view of an alternate embodiment of the invention, showing an electrosensitive color change failure indicator comprised of electrosensitive material, two electrodes on an insulator and a top transparent window.
Figure 10:
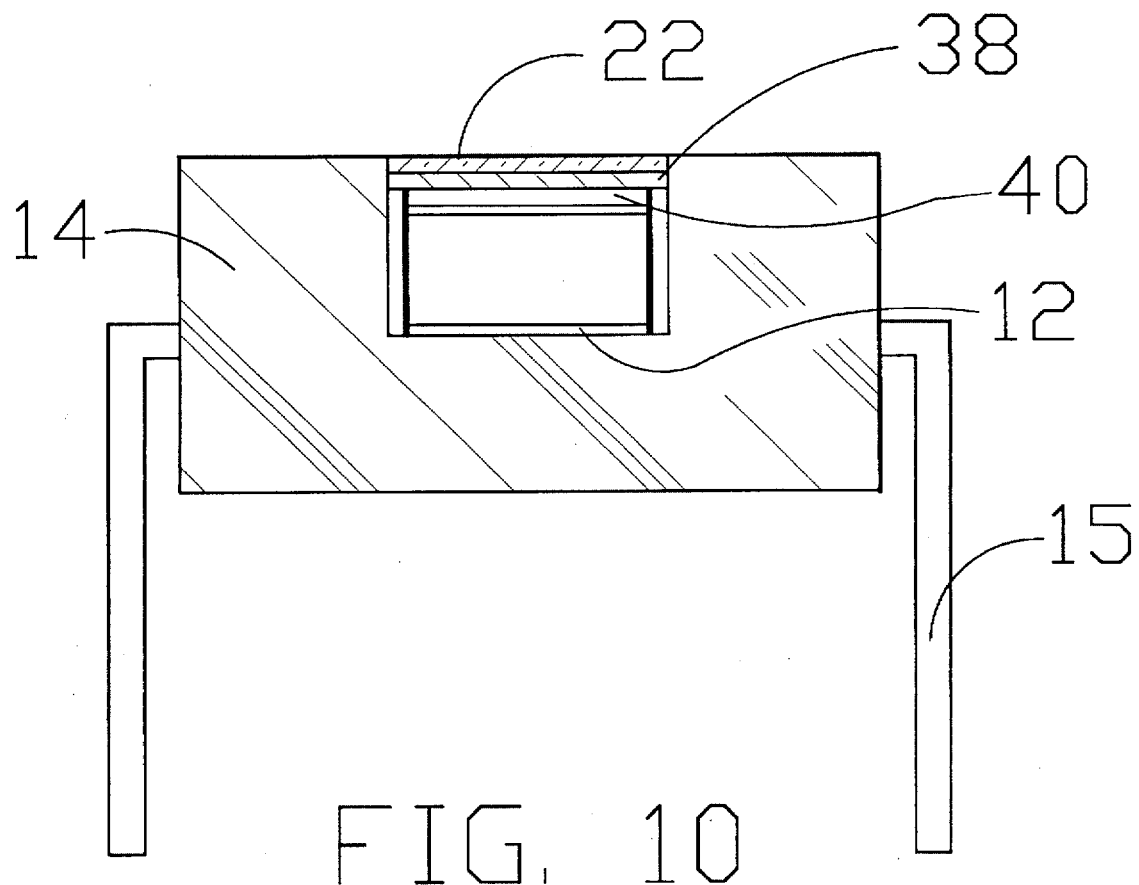
FIG. 10 is a cross sectional view taken along line 10—10 of FIG. 9.
Figure 11:
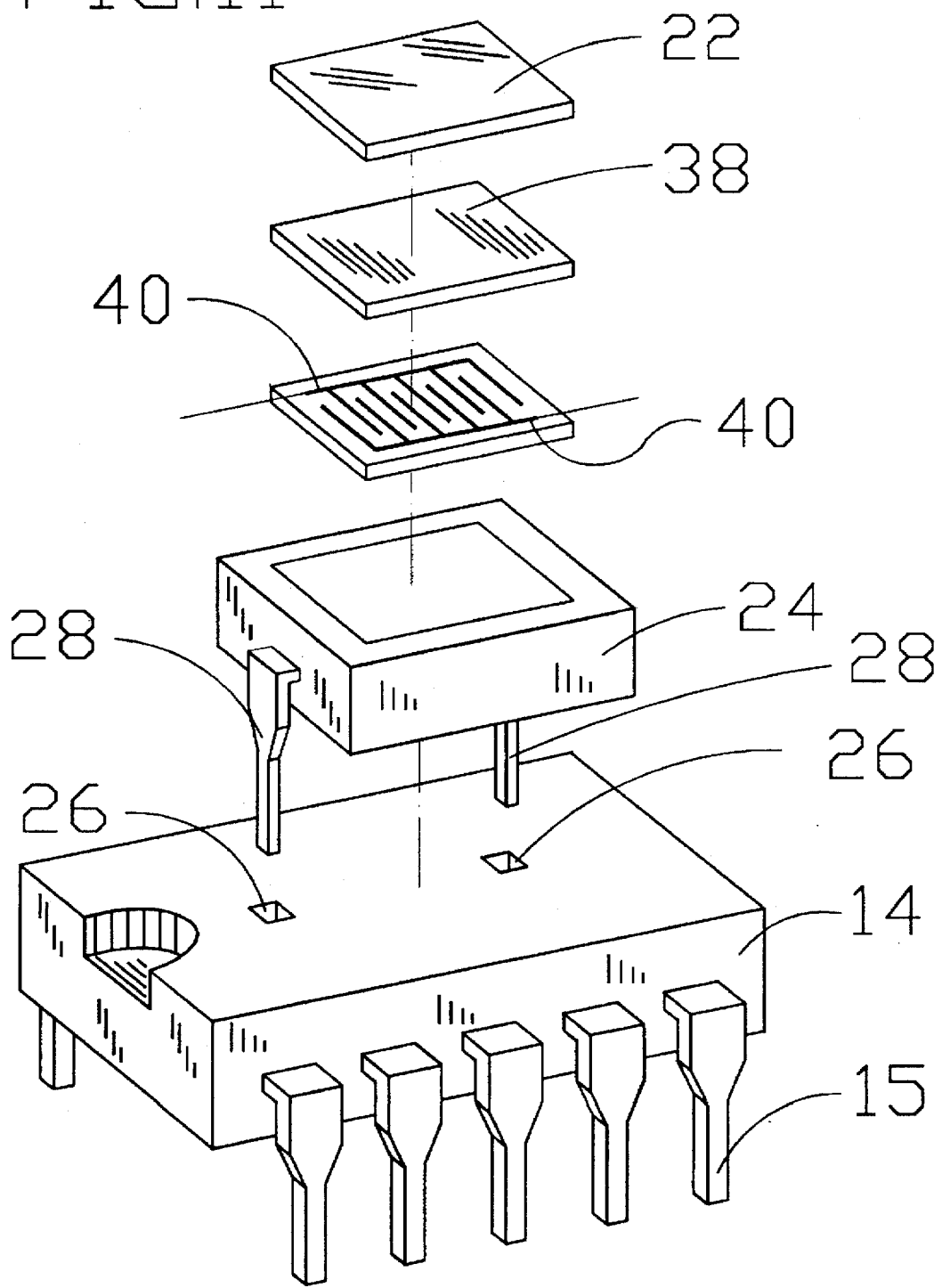
FIG. 11 is an exploded perspective view of an alternate embodiment of the invention, showing an electronic component with a replaceable indicator module containing an electrosensitive color change indicator comprised of the electronic component, two electrodes on a printed circuit board, electrosensitive material, and a transparent window.

In another embodiment of this invention, electrosensitive material 38, which changes color when activated by a pulse of electrical power, is substituted for the filament 18 and thermosensitive material 20 (See FIGS. 9, 10 and 11). The pulse of power from the test circuit is applied through two electrodes 40 which touch the electrosensitive material 38, but not each other. Alternatively, electrosensitive material may fill the space between the two electrodes. Such materials are well known and are used in products such as electro-recorders and electrofax paper. Such products contain iodides (iodide of potassium), starch, bromides, or potassium salts. The pulse of power will permanently change the color of the electrosensitive material, but greater voltage will be required. Alternatively, electro-sensitive paper may be placed in contact with the electrodes.

When power is applied to an integrated circuit, an embedded circuit within that integrated circuit can test the operation of that integrated circuit for such operations, such as correct switching time, whether all inputs and outputs are active with correct voltages and logic states, etc. When the self-testing self-diagnosing integrated circuit detects that the circuit is not in proper functioning condition, then it can output a signal which will trigger the visible change indicator on the surface of the electronic component.

In another embodiment of the invention, alpha-numeric characters 42 (FIG. 13) may be printed on thermo-fax paper under a window on the top surface 44 of an electronic component 14, and indicate in printed words or numbers a diagnosis or statement of what is wrong with the component itself, or of associated components. An alpha-numeric display matrix comprised of thermo fax paper covering a matrix array of resistive film segments or dots is on the top surface of a microprocessor or integrated circuit. Each segment (or pixel dot) of each alpha-numeric character has a resistor film segment capable of heating a segment of a thermo fax paper above it. Each associated resistive film segment has attached to it a dot or segment driver, such as a dot matrix alpha-numeric light emitting diode dot matrix display driver or a liquid crystal display driver. Such a segment or dot display driver will supply the current sufficient to heat each segment or pixel dot of resistor film, thereby printing by changing the color of individual segments of the alpha-numeric display on the thermo-fax paper. Such a display driver would be supplied binary information from a display controller which would be supplied information from a circuit monitoring circuit. Thus, this permanent and irreversible thermo-fax alpha-numeric display on the top of the electronic component can indicate the precise nature of the fault in the component, its associated components and circuits.

Figure 12:
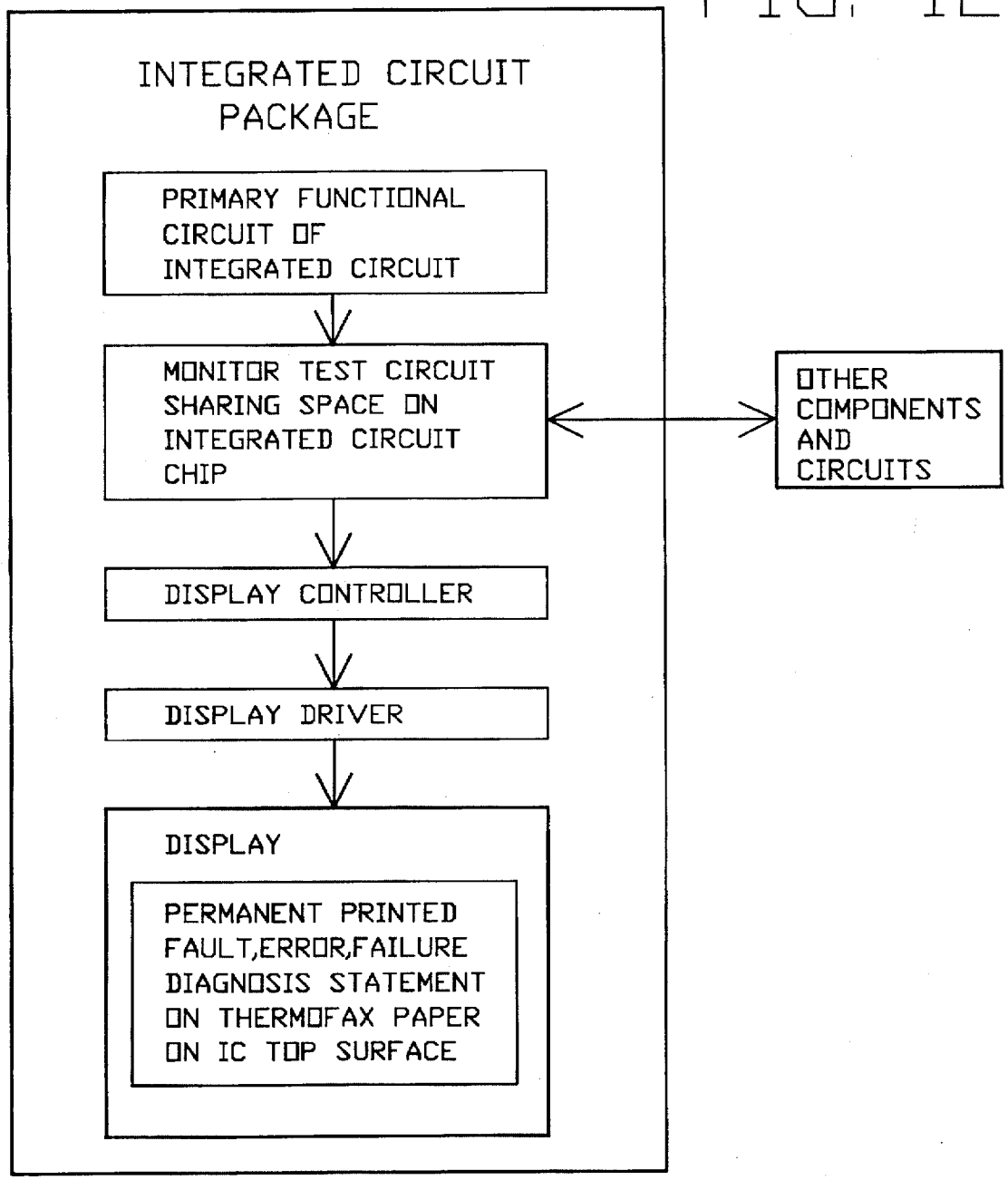
FIG. 12 is a functional block diagram of an integrated circuit containing a test circuit, functional circuit, display controller, display driver, and an alphanumeric printing display of failure diagnosis on the integrated circuit package surface.

This permanent irreversible thermo-fax alphanumeric display on an integrated circuit package top surface has also self-contained and built within its same integrated circuit package a display driver, display controller, monitoring circuit, and a circuit of the primary alternate function of that integrated circuit (as shown in FIG. 12). Essentially the thermo fax display segments would be multiplexed or energized, just as in any liquid crystal display or light emitting display for at least a short time. Therefore, if the monitoring circuit detected a failure of its own circuit, its adjacent functional circuits, or other components external to it, it would communicate to the thermo fax display controller to drive the individual resistive heating matrix segments to permanently print on the thermo fax paper above it a statement of diagnosed trouble, failure, or error message on the top surface of the integrated circuit package, which would be visible and readable by a technician. A liquid crystal display on an integrated circuit, with an internal test circuit powered by an embedded battery, can also be used to display an error message for a considerable length of time.

Figure 13A:
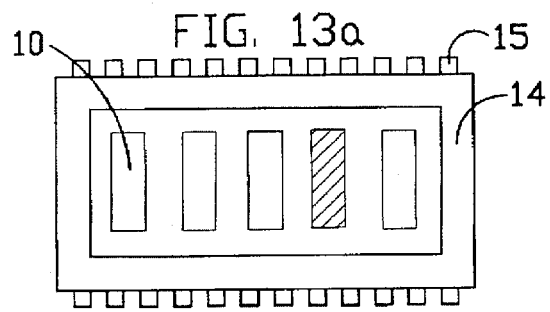
—FIGS. 13a and 13b show multiple failure indicators.
Figure 13F:
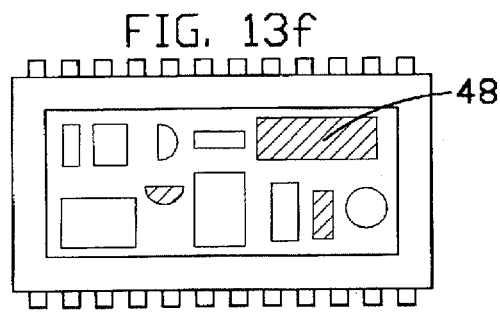
FIG. 13f shows the failed component (s) in a pictorial representation of the circuit board.
Figure 13B:
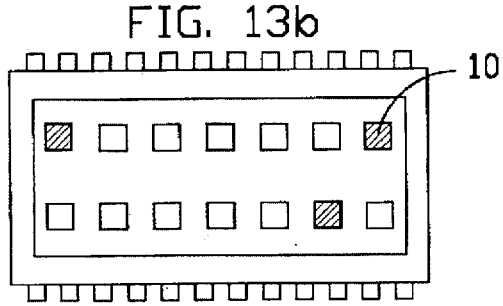
Figure 13G:
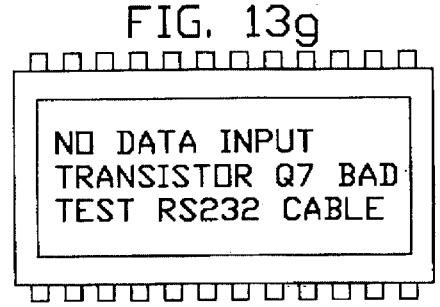
FIGS. 13d, 13e, 13g, 13h, 13i and 13j show alphanumeric failure indicators.
Figure 13C:
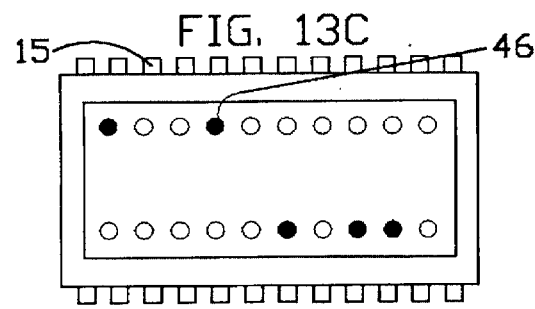
FIG. 13c shows which pins have failed.
Figure 13H:
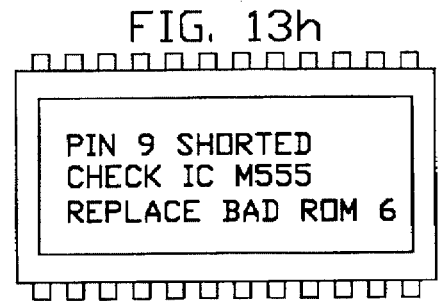
Figure 13D:
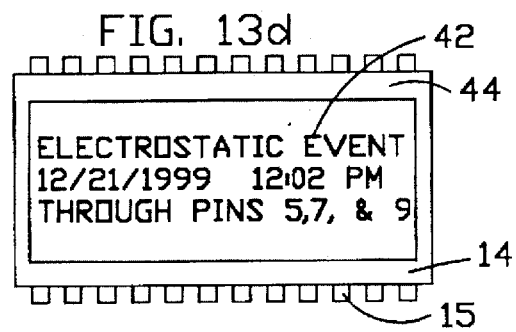
Figure 13I:
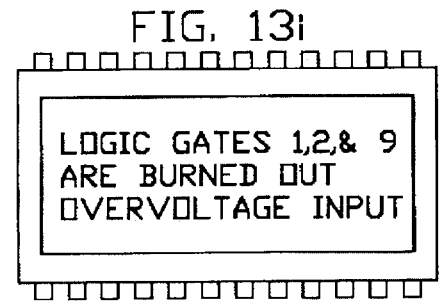
Figure 13E:
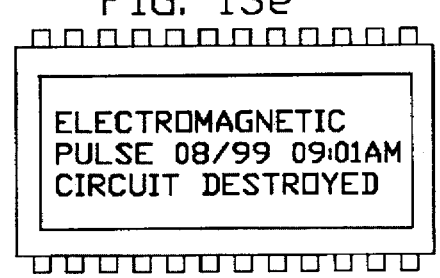
Figure 13J:
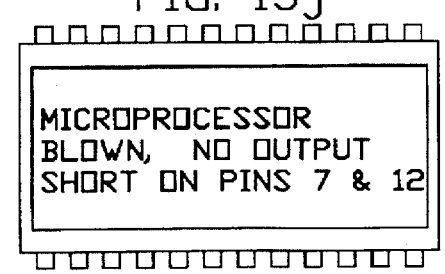

In a similar embodiment, a short on a pin of an integrated circuit can be displayed as a darkened dot 46 next to that pin helping to indicate external circuit problems (as shown in FIG. 13c).

In another similar embodiment, the actual failed component 48 on a circuit board can be depicted on the surface of the integrated circuit by activating the dots within its outline picture on the thermo fax paper or just by indicating its position and shape on the thermo paper (as shown in FIG. 13f).

In some of the alpha-numeric and graphic display failure indication means embedded within an integrated circuit or other component, a set of parallel bottom electrodes 58 connected to row connections 52 of the display segments 54 and a set of top electrodes 56 with column connections 50 of the display segments are both connected to opposite sides of each individual display segment pixel (as shown in FIG. 14). In other indicator display, electrodes are attached to each individual alpha-numeric segment.

Embodiments of this invention can be contained within a light emitting diode, laser diode, florescent lamp, incandescent light bulb, or other source of light, so that a surface failure indicator can visibly indicate that such a device has failed. If a light source, such as a light emitting diode, is supplied with power, but does not emit light, then a built-in light sensor and test circuit can logically trigger a pulse which will activate the failure indicator permanently marking the light emitting diode. If there is power to the light emitting diode, but no light is emitted, then the light sensor will detect no light and the test circuit will trigger the indicator to change color. A wire filament under a high temperature thermosensitive paper in series with a resistor may both be connected in parallel to the illumination filament of the light bulb or to the heater filament of an electron tube or florescent tube. If the filaments of the bulbs or tube burns out, current will increase through the failure indicator filament, thereby heating it and changing the color of the thermosensitive material next to it. Such a failure indicator can be placed within the base of the bulb or tube, so as to be visible on its surface.

The hereinabove discussed embodiments basically deal with the situation where the indicator undergoes a color change when there is a fault. In each of the above described examples, however, it is also possible to use the hereinafter described visible indicator, wherein, instead of a color change, the visible indicator undergoes some other type of change, such as a bending or change of position.

Figure 15:
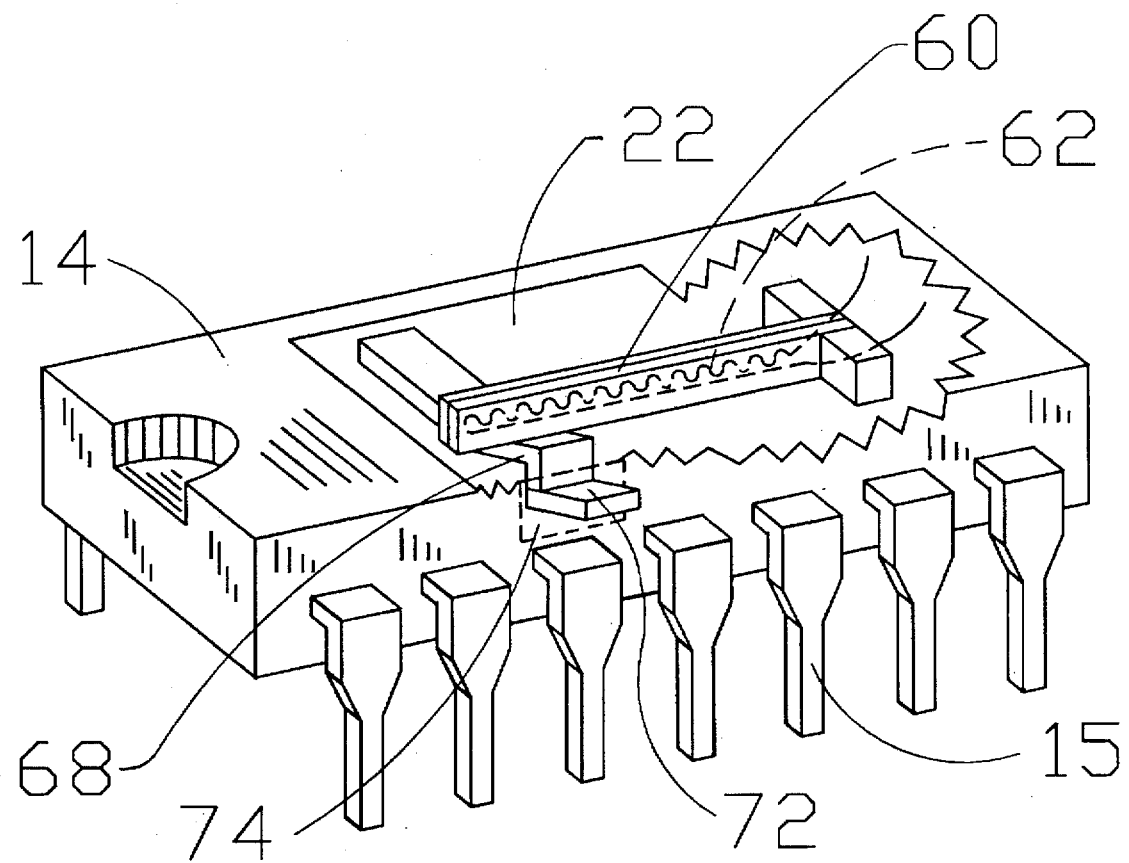
FIG. 15 is a perspective view, partially broken away, of an alternate embodiment of the invention, showing a visible change failure indicator comprising a bimetallic strip, heater element, flexible leaf spring latch, and reset release button built into an integrated circuit package.

In another embodiment, the visible indicator may undergo an electro-mechanical change upon receiving a pulse. In such embodiments, a bimetallic strip 60 may be used. Upon receiving even a momentary pulse, or possibly a continuous current, such strips will bend when heated by a filament 62. By positioning such bimetallic strips on the surface of an electronic component (see FIG. 15), it will be immediately visible when the bimetallic strip has been bent when the heater receives an electronic momentary pulse.

Figure 16:
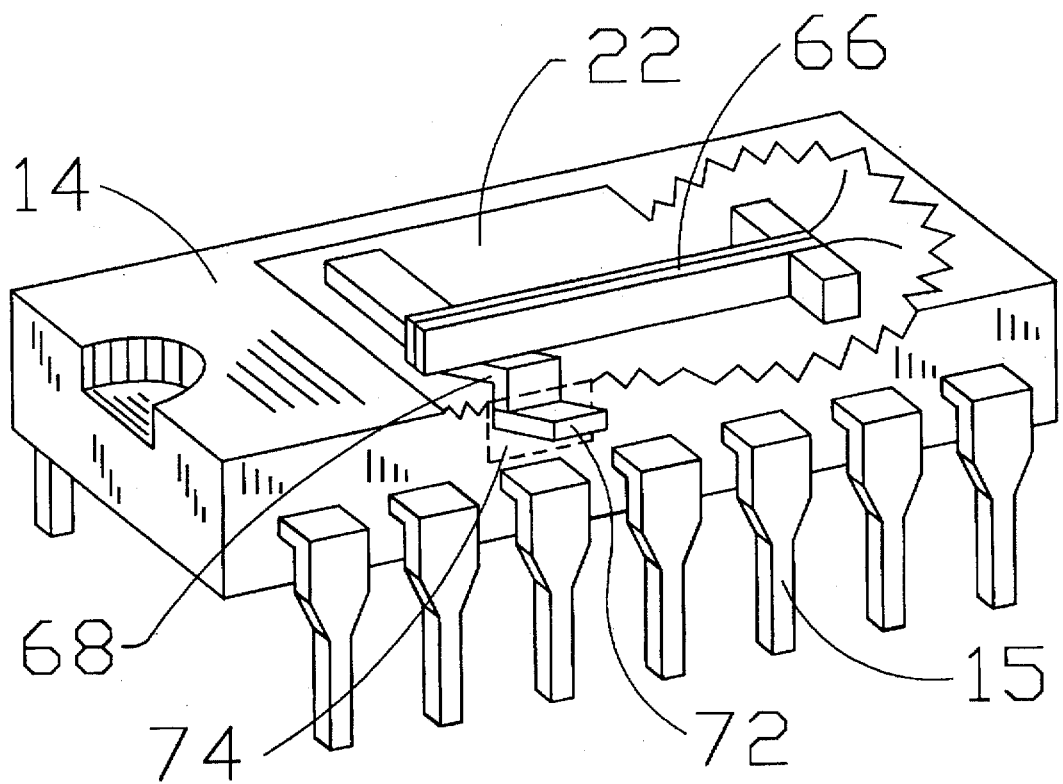
FIG. 16 is a perspective view, partially broken away, of an alternate embodiment of the invention, showing a visible change failure indicator comprising a piezoelectric bender strip, flexible leaf spring latch, and reset release button built into an integrated circuit package.
Figure 17:
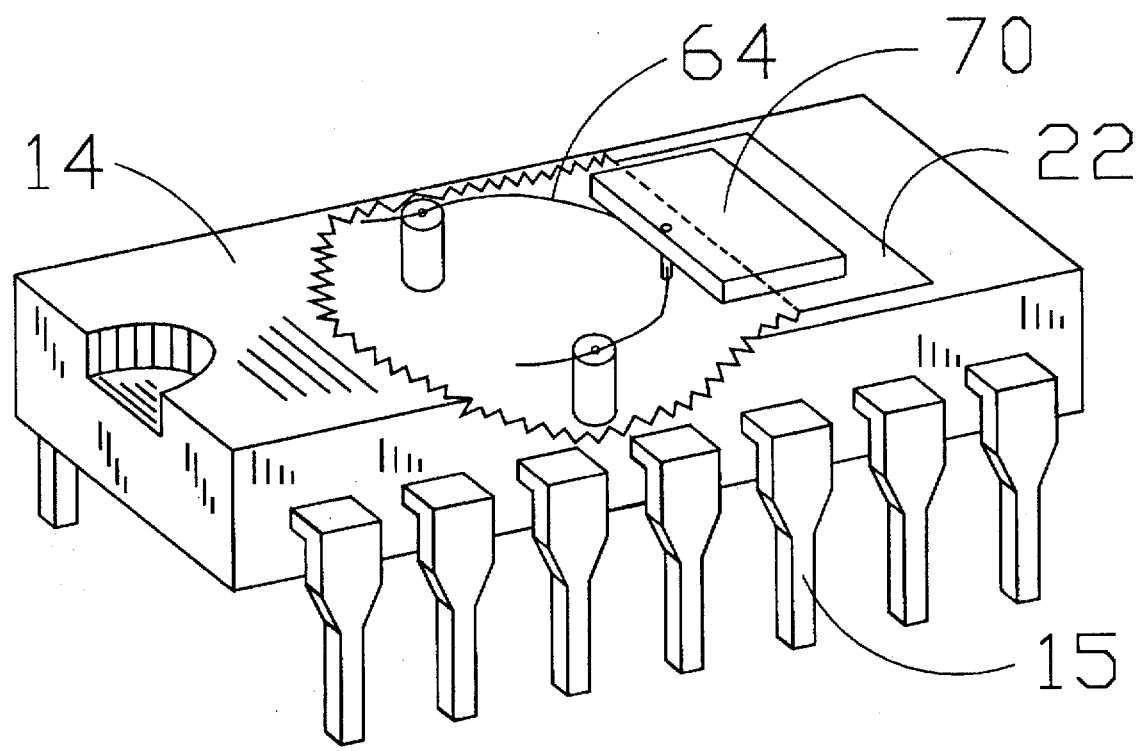
FIG. 17 is a perspective view, partially broken away, of an alternate embodiment of the invention, showing a visible change failure indicator comprising a nitinol wire, sliding door, and flexible leaf spring latch.

Instead of using a bimetallic strip, it is also possible to use Nitinol wire 64 (FIG. 17) or Peizo electric bender 66 (FIG. 16).

As the bimetallic strip bends, it may slide over a ramp edge sawtooth latch 68 and become permanently trapped behind it and thereby prevent it from springing back to its original position. In some embodiments, as it bends, it may mechanically push a sliding material 70 containing a colored mark to become visible from a pocket or opaque covering observable through a window 22. Alternatively, the material containing a colored mark may be pushed by the bending strip out from the side of the electronic component, thereby indicating both a visible change and a changed physical appearance as a result of the movement. By pressing a mechanical reset button 72 extending through an opening 74 in the top (or side) of the electronic component, the internal latch 68 holding the bent strip 60 (or 64 or 66) from moving may release its hold on the strip, thereby allowing the strip to return to its normal position for reuse as an indicator.

Figure 18:
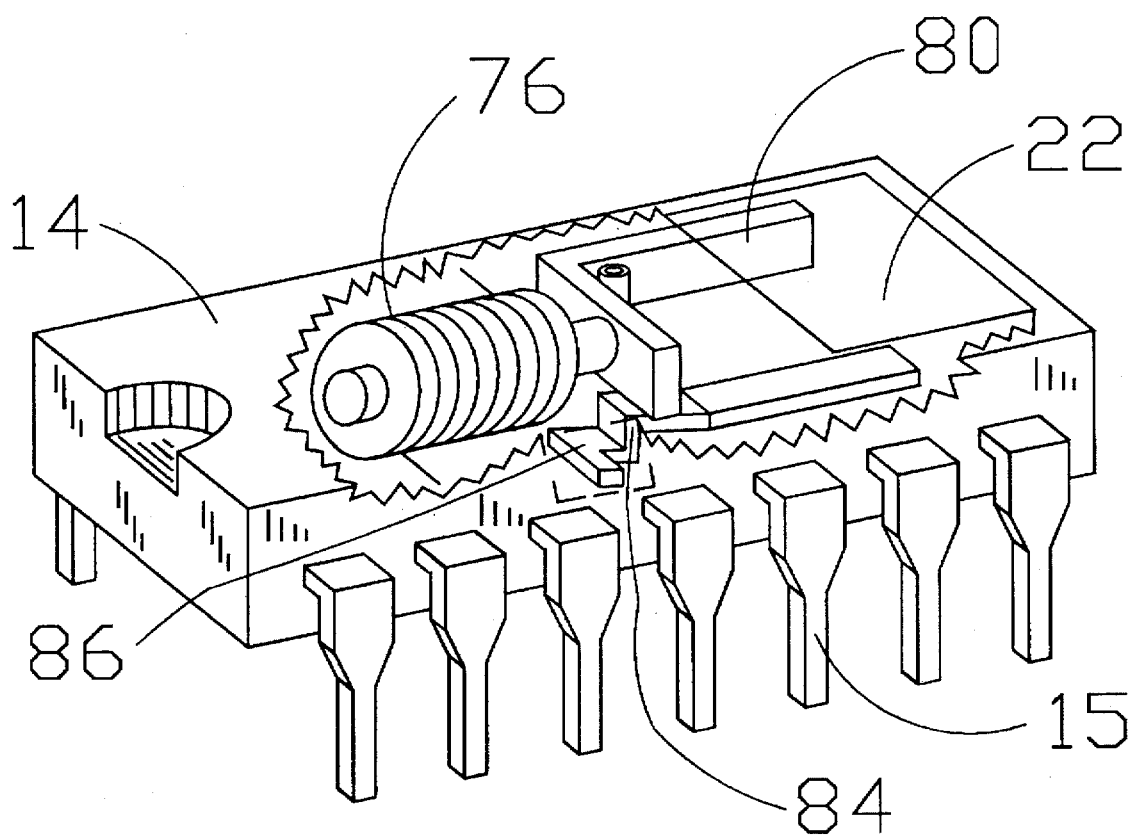
FIG. 18 is a perspective view, partially broken away, of an alternate embodiment of the invention, showing a visible change failure indicator comprising an electro-mechanical relay, movable marker attached to the armature, flexible leaf spring latch, and release reset button.
Figure 19:
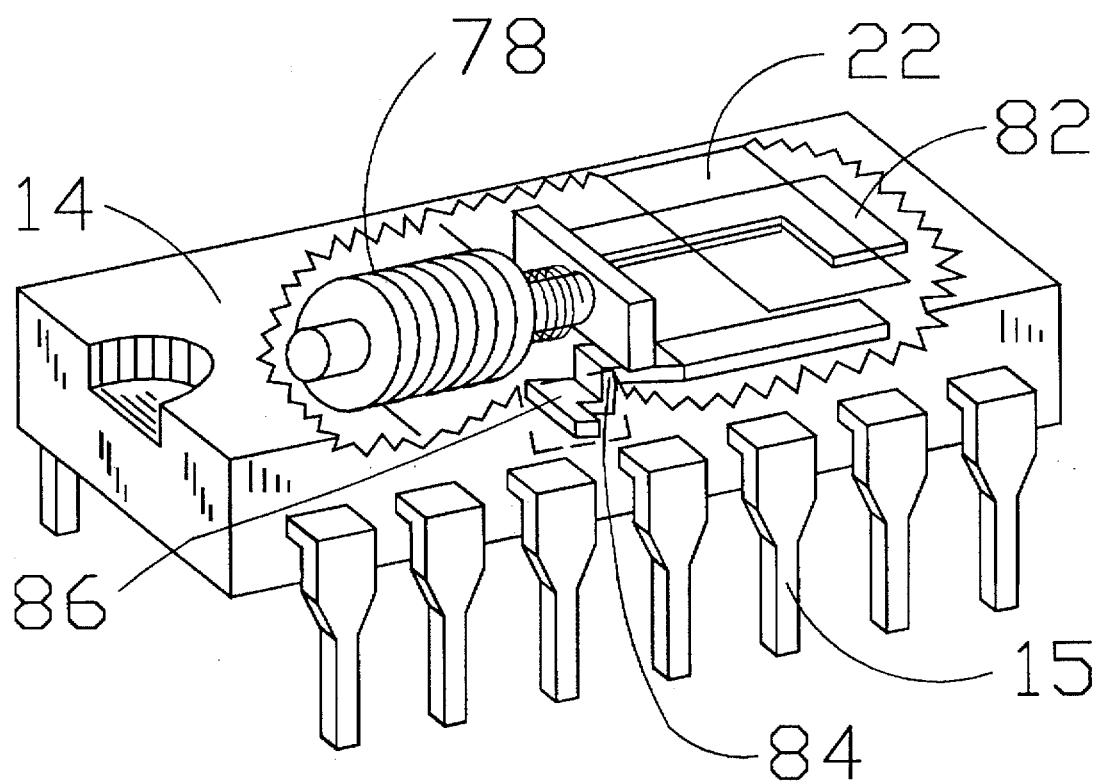
FIG. 19 is a perspective view, partially broken away, of an alternate embodiment of the invention, showing a visible change failure indicator comprising a solenoid, a movable marker, and a top transparent window.

In other embodiments of the invention, a micro miniature electro mechanical latching relay 76 or latching solenoid 78 may be used and activated by the momentary pulse (see FIGS. 18 and 19, respectively). This movement of the relay or solenoid can be used to move a device 80 from one position to another, thereby indicating a fault or failure of the electronic component. A latch 84 may be used to secure the device 80 in position after it is moved, so as to permanently indicate a failure. In some embodiments, a reset device 86 may be used to release the device 80 from the latch 84, so the failure indicator may be reused. The relay or solenoid can move a small door 82 or other device to display a particular color through the transparent window 22 on the surface of the integrated circuit. Further, it may be used to move a needle or other indicator, so that it moves from one position to another position, thereby indicating a failure. Both latching relay and solenoid can be unlatched and reset as in larger units for reuse.

Figure 20:
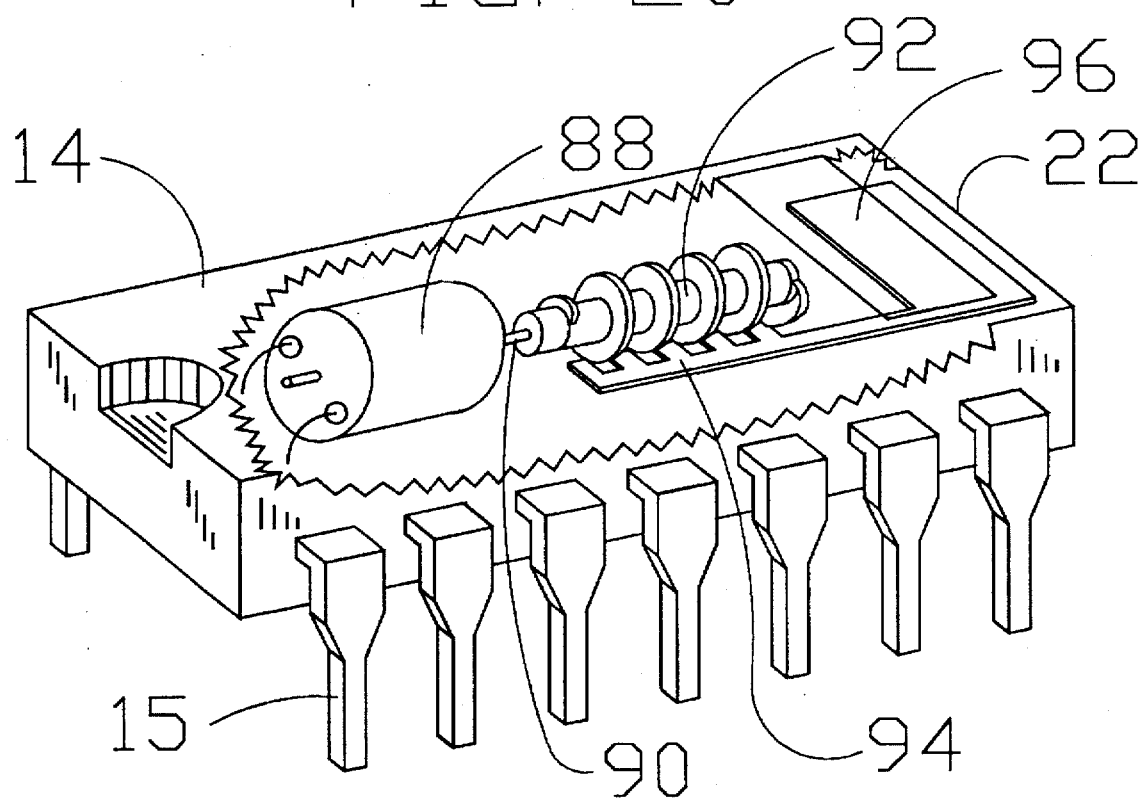
FIG. 20 is a perspective view, partially broken away, of an alternate embodiment of the invention, showing a visible change failure indicator comprising a micro-motor, screw gear, rack gear on a movable marker, and a transparent window.

In a similar embodiment of this invention, instead of a relay or solenoid, a microminiature mechanism may be used. For example, an embedded micro motor 88 whose center axle 90 has a gear 92 mounted on it can engage a rack gear 94 and will push the rack gear, thereby pushing a sliding door 96 to become visible underneath a transparent window on the top of the electronic component (FIG. 20). Such a motor can be made by micro fabrication techniques, micromachining, ion sputtering, electrodeposition, etc. It may be electrostatically or electromagnetically driven. Alternatively, it can be a small macroscopic AC or DC motor.

Figure 21:
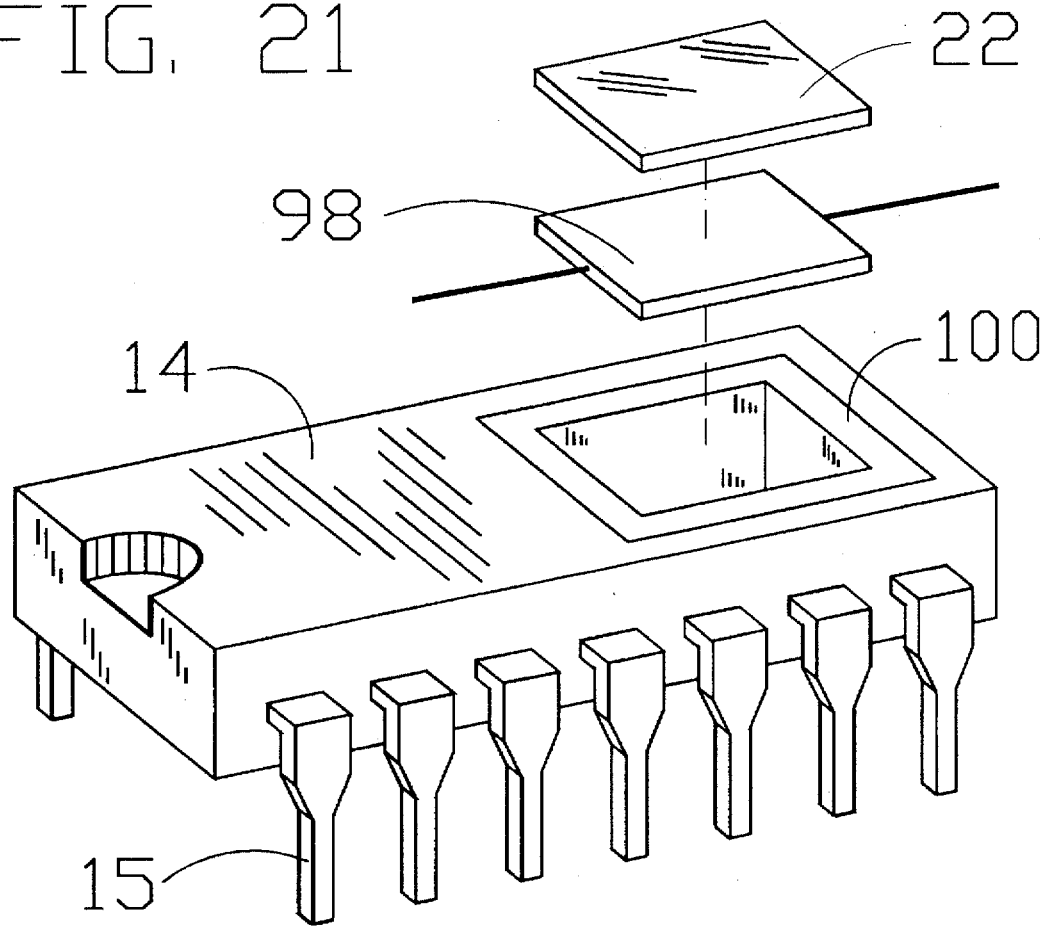
FIG. 21 is a perspective view, partially broken away, of an alternate embodiment of the invention, showing a visible change failure indicator which includes a thin film fuse.

In still another embodiment of the invention (FIG. 21), the failure indicator may be comprised of a thin film fuse element 98 made of a conductive thin film and placed under a transparent window 22 on the surface of the electronic component. When the visible thin film fuse blows, by reason of a failure in the device, its color changes very visibly. This can be detected through the transparent window with colored border 100 and thereby indicate a failure of the component.

Figure 22:
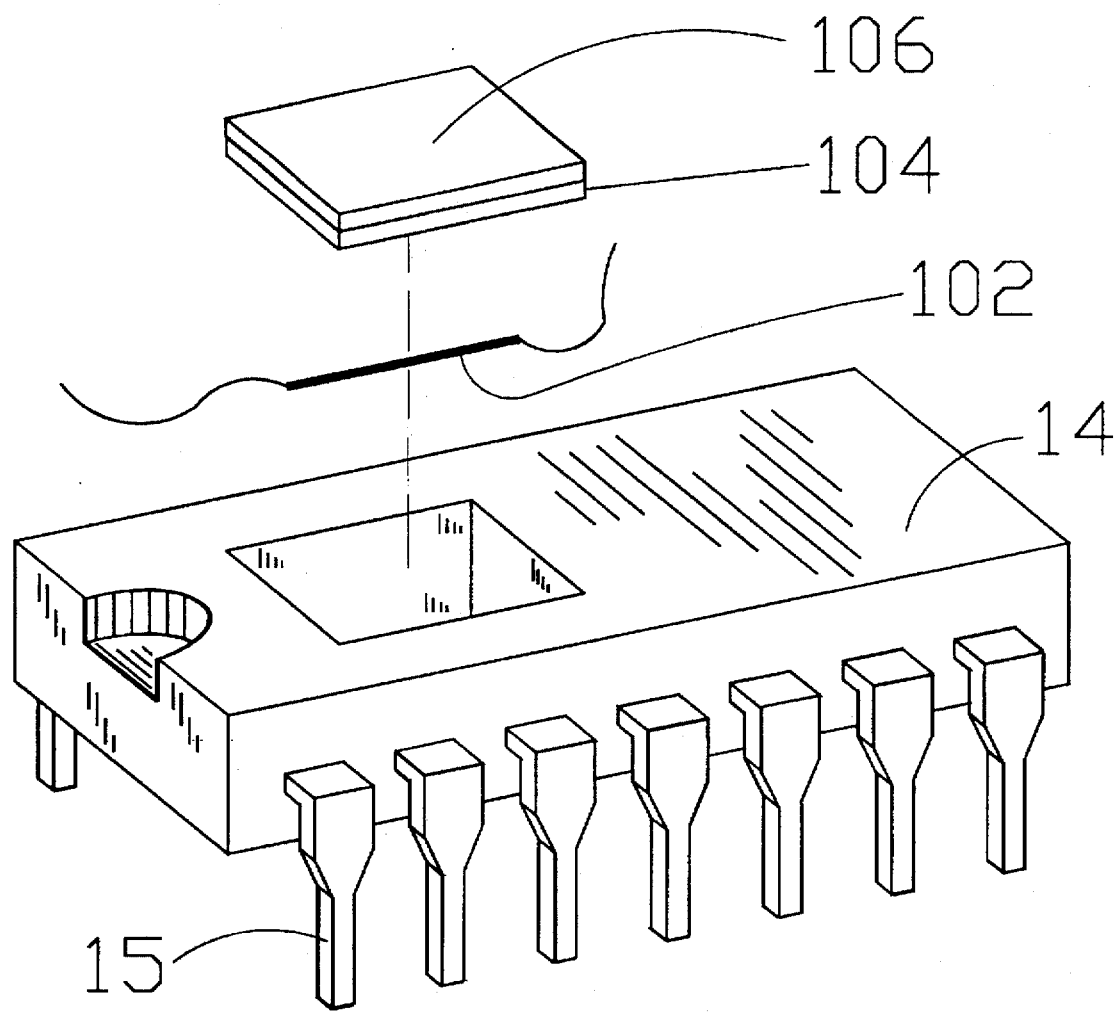
FIG. 22 is a perspective view, partially broken away, of an alternate embodiment of the invention, showing a visible change failure indicator which includes a thin conductive fuse.

Still another embodiment (FIG. 22) provides a thin conductive fuse 102 is embedded, runs through, or is placed under a burnable or explosive chemical or thermosensitive material 104 that is positioned under an explosion proof window 106 in a non-burnable package with high melting point. Upon activation of the fuse, the chemical burns or "explodes", or changes color, thereby creating a visible indication through the explosion proof window that there had been a failure.

Figure 23:
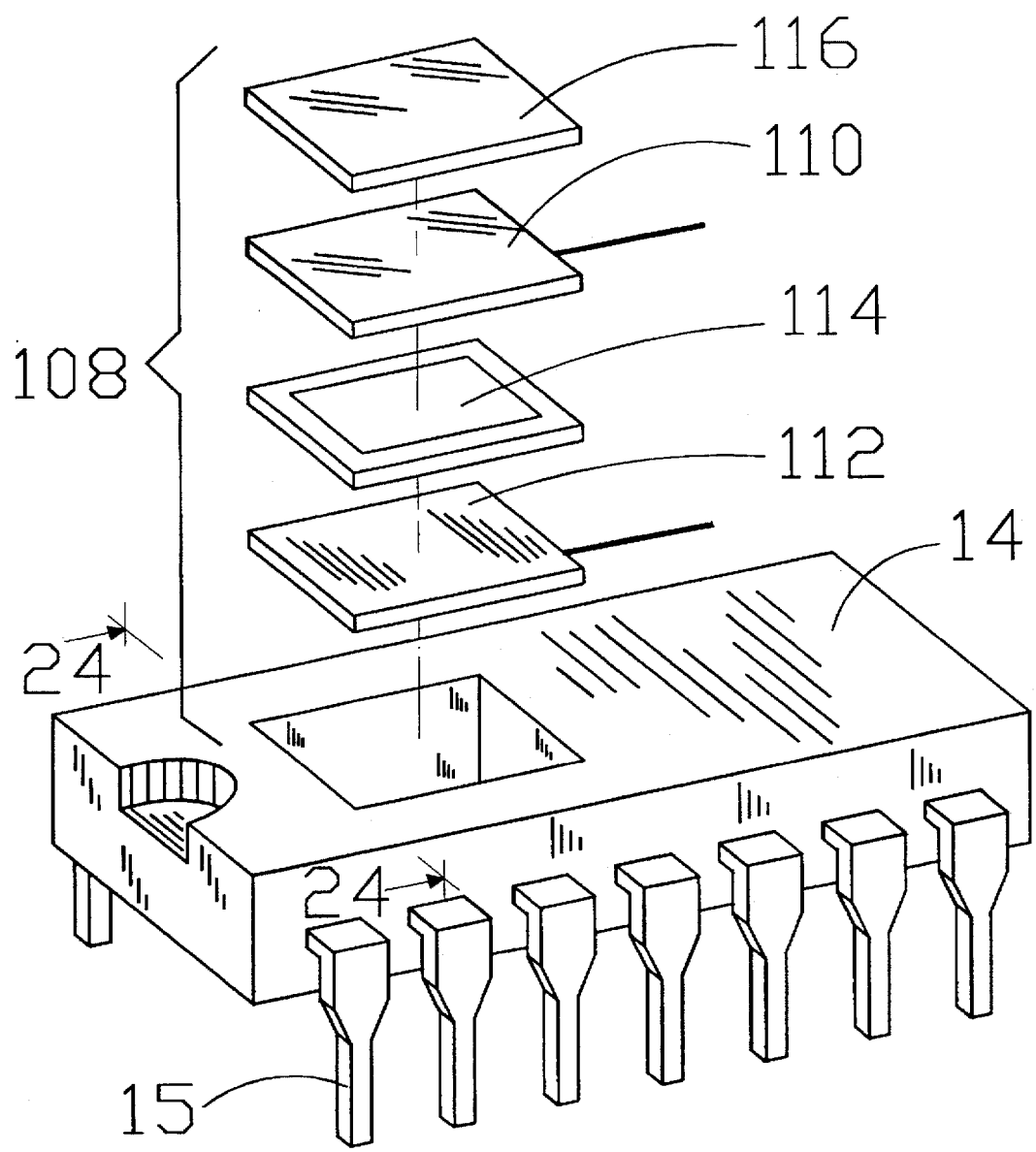
FIG. 23 is an exploded perspective view of an alternate embodiment of the invention, showing a visible change failure indicator which includes an electro-deposition failure indicator.
Figure 24:
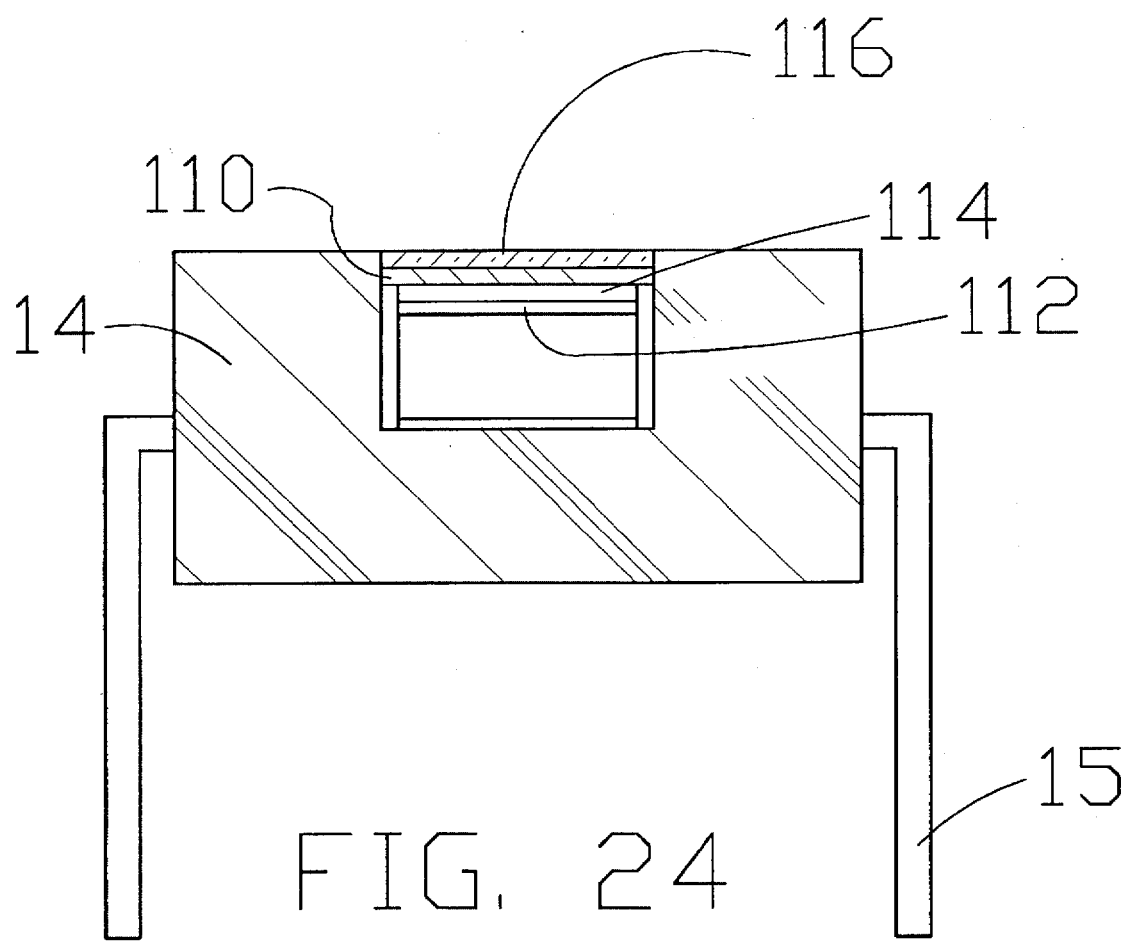
FIG. 24 is a cross sectional view taken along the line 24—24 of FIG. 23.

Other embodiments of the invention may include electrodeposition failure indicators (FIGS. 23 and 24). A sealed cell 108 may be comprised of a cathode 110, anode 112, electrolyte 114, and a transparent window 116 and built into the surface of an electronic component. The cathode may be either an upper transparent window with a transparent conductive coating acting as a seal or as a window or a transparent conductive film with a glass coating above it acting both as a seal and as a window or a transparent window and a conductive transparent film sandwiched with it or a window above a metallic conductive electrode viewable through the window. The electrolyte is a conductive ionized electrolytic gel or solution whose metal ions are of the same metal as the anode. This solution or gel is touching both the anode and the cathode. The anode is a metallic conductor which is decomposed by electrolysis and deposited by electro deposition on the cathode after passing through the electrolyte solution or gel by means of electrophoresis. This indicator cell works by means of electrophoresis or cataphoresis, whereby electrically charged solute particles present in a colloidal solution or gel migrate from the anode towards the oppositely charged cathode when the two electrodes are placed in the solution and connected to an electrical source. A self-contained self-test circuit in electronic component would switch on a continuous current for a limited preset time, thereby causing the cell to electroplate the cathode and this would be visible through the window in the cell, thereby indicating a fault. Such a device can be embedded within the electronic component and be visible through an appropriate window.

Figure 25:
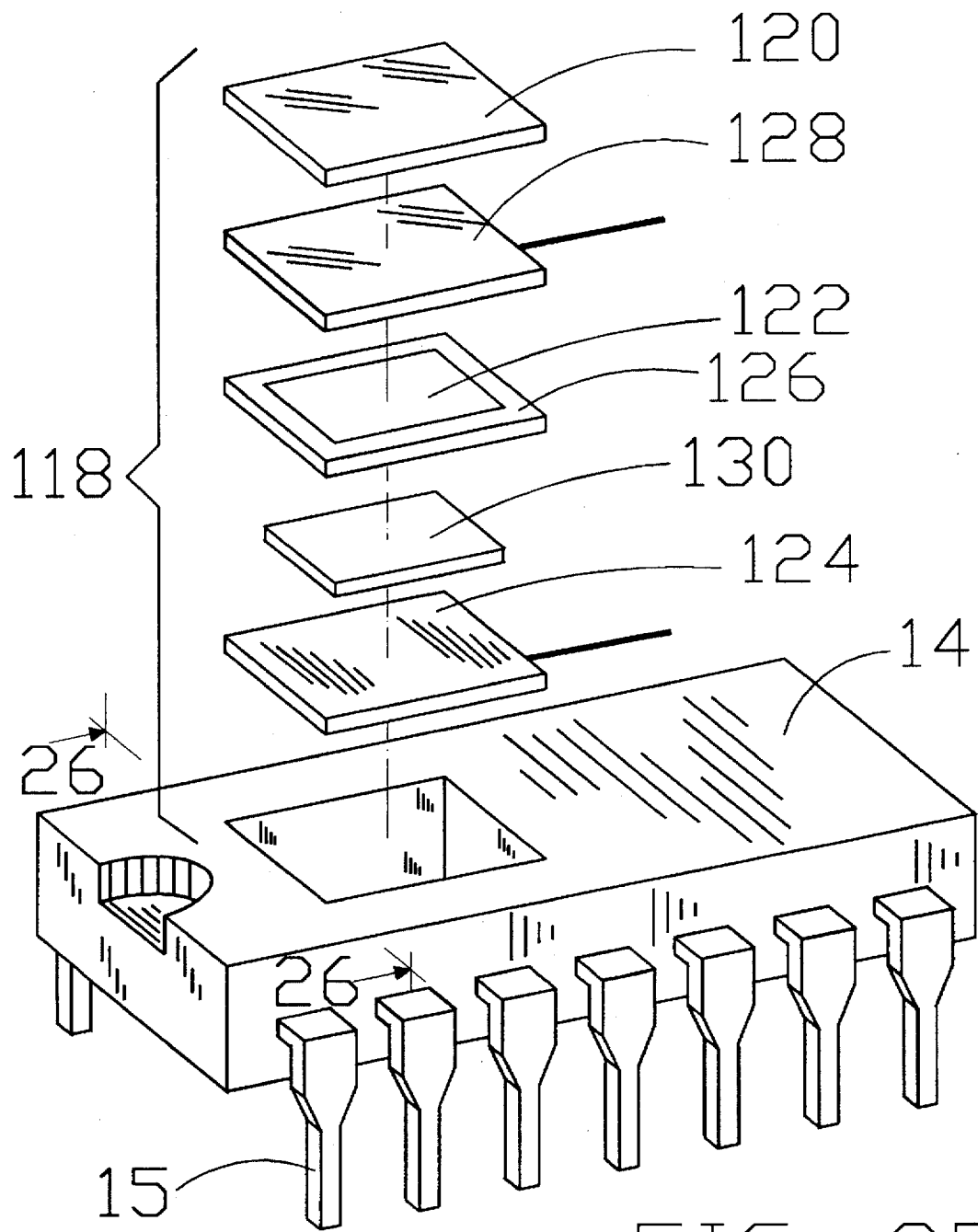
FIG. 25 is an exploded perspective view of an alternate embodiment of the invention, showing a visible change failure indicator which includes an acid-base color change indicator.
Figure 26:
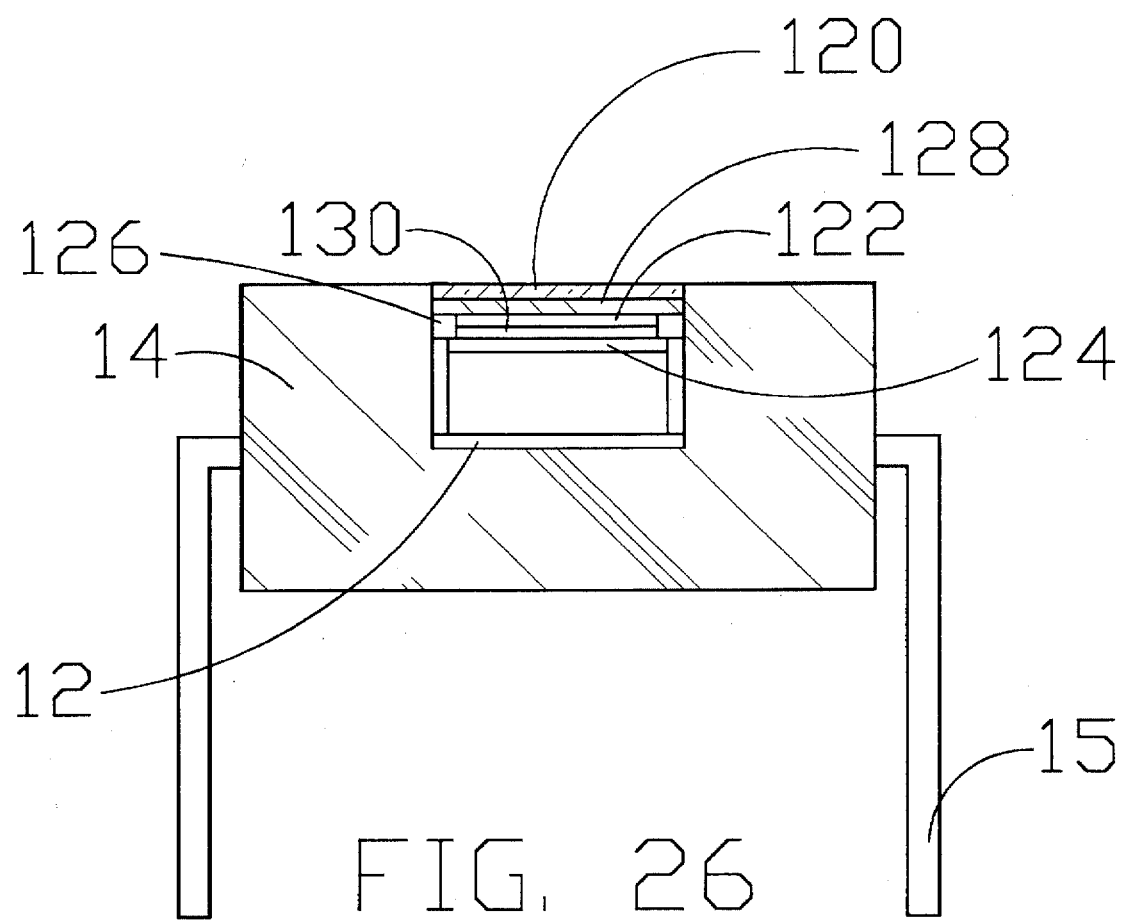
FIG. 26 is a cross sectional view taken along the line 26—26 of FIG. 25.

Another embodiment of the invention (FIGS. 25 and 26) is an acid-base change color indicator cell 118 sealed into an electronic component. It comprises a top transparent window 120, an acid or base electrolyte 122, an anode 124, a seal 126 and a cathode 128. The acid-base indicator film coating or material 130 on the surface of the window or an acid-base indicator chemical layer of a material is viewable through the top surface transparent window. Certain organic substances are able to change color in a dilute solution when the concentration of hydrogen ions in the solution reach a particular value. An acid-base indicator displays through characteristic color changes the degree of acidity or basicity of solutions or gels. For example, phenolphthalein is colorless in an aqueous solution in which the hydrogen ion concentrate is greater than 10–9M, or the pH is less than 9. In a solution where the hydrogen ion concentration is less than 10–9M, the phenolphthalein makes the solution red or pink. Substances like phenolphthalein are called acid-base indicators and are used as indicators of a solution. When direct current electricity is applied to the anode and to the cathode immersed in an electrolyte, electrolytic, electrophoretic and electro-deposition action takes place. As electrolytic action occurs, it changes the pH of the electrolyte solution, thereby changing the color of an acid-base indicator, such as litmus paper or phenol-phthalein. Such a color change can thus be observed through the cell window. In the situation where the electronic component has contained within itself this type of acid-base change color indicator cell with a self-testing circuit, a failure can easily be indicated through the test window. Whenever there is a failure, an appropriate signal can be used to generate the necessary direct current electricity. If an acid or neutral solution is electrolyzed to basic, litmus paper will change color from red to blue and phenol-phthalein will change from colorless to red. Acid-base indicators such as methylviolet, metacresol purple, thymol blue, tropeline 00, bromphenol blue, methyl orange, bromocresol green, methyl red, bromcresol purple, bromthymol blue, phenol red, cresol red, orthocresol phthalein, phenolphthalein, thymol phthalein, alzarin yellow or malachite green can be used in such a unit.

Still another type of embodiment includes an electrochromic cell, a tungsten trioxide electroplating cell, and viologen display cells which can be used as the indicator. Such displays are well known, but previously such cells had not previously been built into the surface of electronic components.

Figure 27:
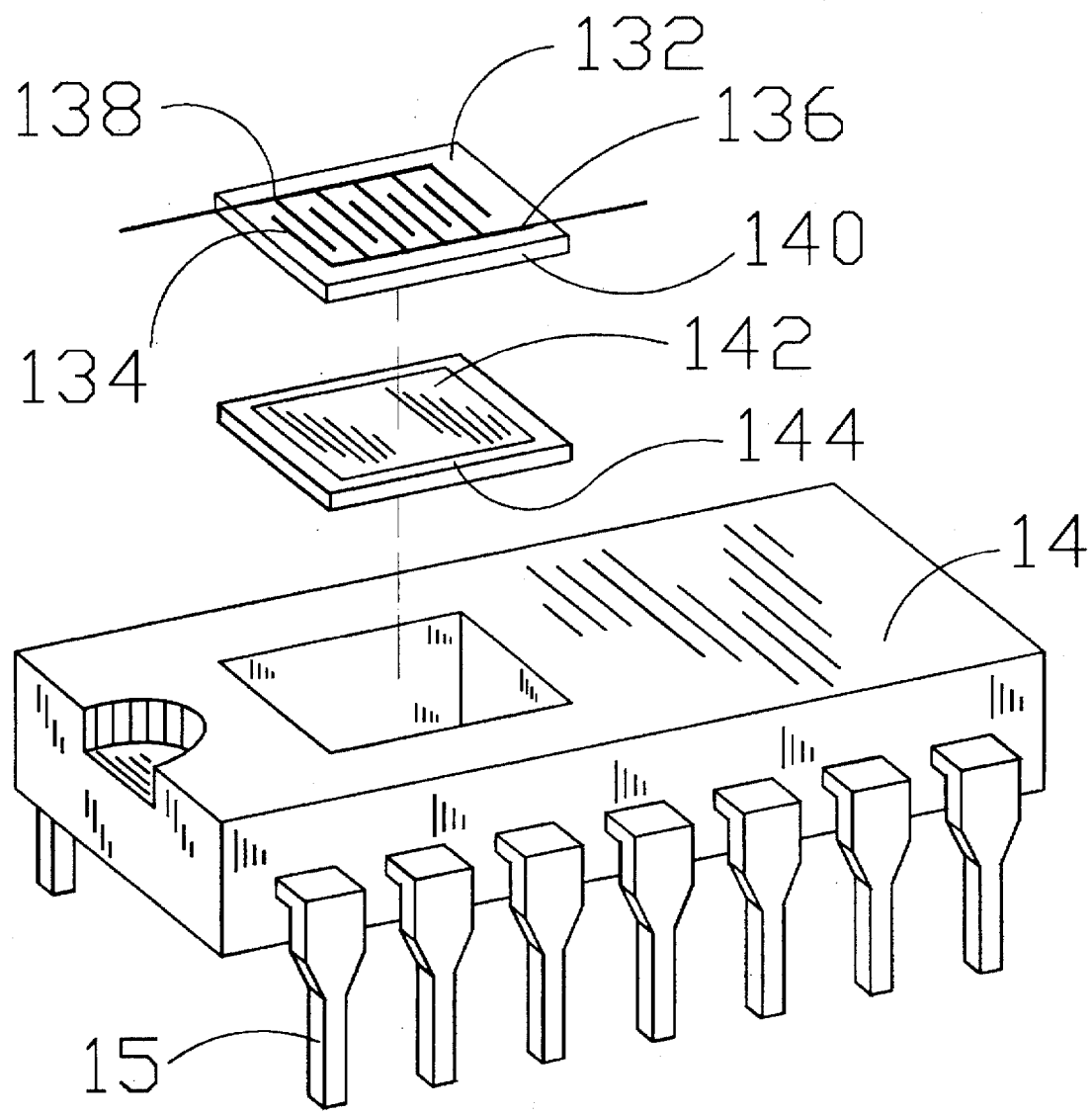
FIG. 27 is an exploded perspective view of an alternate embodiment of the invention, showing a visible change failure indicator which includes an electrochromic failure indicator cell.

An electrochromic failure indicator cell built into the surface of an electronic component (FIG. 27) may comprise a top glass piece 132 with a first transparent electrode 134 (typically vacuum deposited indium and tin oxides on the inside surface of the top glass window); a conductive lead 136 from this electrode 134 to the edge of the glass; silicon dioxide insulating layer deposited on the conductive lead; a second electrode 138 with insulated leads made by depositing metal on the conductive lead; a thin colorless film of tungsten trioxide ($Wo_3$) 140 is vacuum deposited on the transparent patterned electrodes; a bottom glass plate 142; and, an epoxy glass seal 144 between the top and bottom glass plate layers. To operate this electrochromic change color visible indicator, 1½ DC volts are applied to the electrodes. A very rapid clear color change takes place in ⅕th to ½ of a second. This is a visible change which will be visible through the window on the surface of the electronic component. Further, this change may generally be irreversible, so as to provide a permanent indication of a failure.

Viologen electrochromic cells work as in an electro plating cell. The electrochromic cell undergoes a color change in viologen electrochromic displays. An electrolyte in viologen displays is an aqueous solution of a depositively charged organic salt, such as dialkyl derivative of 4.4' bipyridinium bromide. When the transparent electrode is made negative, the electrolyte will change to produce a purple color this will provide a visible change which can be seen through the window on the surface of the electronic component.

It is even possible to use a cell making use of the phenomena of Nobili's rings. When electrolysis takes place through a lead solution where the anode is a plate of polished metal lying horizontally under a platinum wire as a cathode, deposition takes place in rings showing rainbow tints (also called metallochromes). Metallochromes are symmetrical rings of varied color due to deposits of lead peroxide. This was observed by Nobilli in his experiments in electrolyzing a solution of lead. Such a cell provides a visible change that can be seen through the transparent window on the surface of the electronic component.

Figure 28:
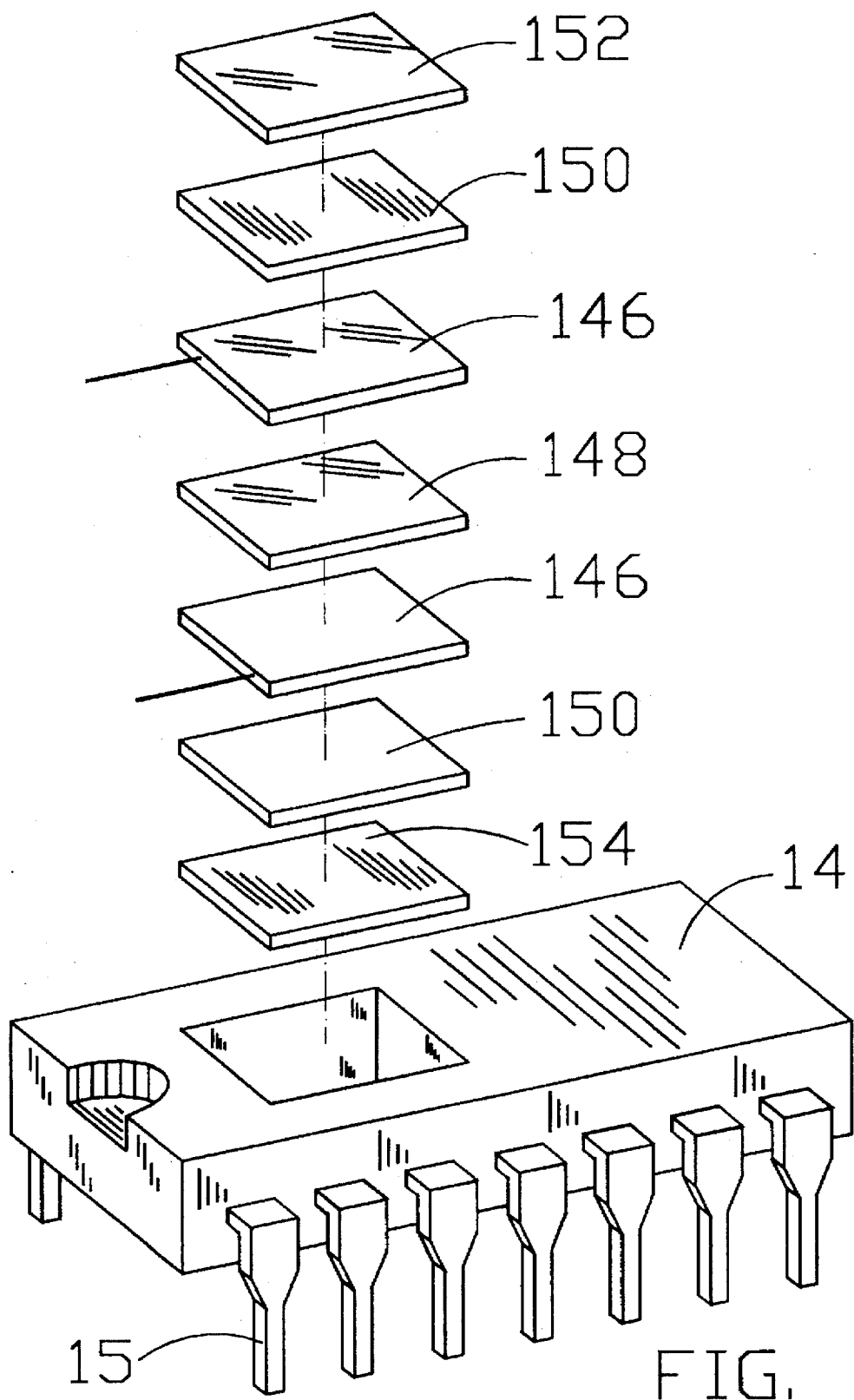
FIG. 28 is an exploded perspective view of an alternate embodiment of the invention, showing a visible change failure indicator which includes an ferroelectric color change display indicator.

In another embodiment of this invention, a ferroelectric display is used as a failure indicator built into an electronic component (as shown in FIG. 28). This optoelectronic bistable visible display indicator changes states from one color (or shade) to another when energized by a momentary pulse from a test circuit when a failure is detected within an electronic component. It will hold its changed color state for many years after the initial pulse of direct current and after all power is removed. It can be reset for reuse by an additional reverse polarity pulse. It is comprised of several layers in a stack viewed through a top transparent window on the surface of an electronic component. Two transparent conductive electrodes 146 are made of conductive indium-tin oxide, and between the electrodes a thin film polarizing plate of transparent (PLZT) ceramic lead lanthanum zirconate titanate 148 is placed. Two transparent thin film polarizers 150 are disposed adjacent to respective electrodes to define a sandwich with the PLZT innermost, then the conductors and then the polarizers. With the transparent window 152 on top and a mirror 154 on the bottom of the above described stack of layers, this comprises the complete ferroelectric display indicator. A pulse of direct current to the two conductive electrodes touching (or sputtered upon) the PLZT plate will toggle its directional plane of polarization state from one direction to another. The polarization of such crystal can be reversed by an electric field. In one state of polarization of the PLZT plate, ambient light above the electronic component or light from a flashlight will be able to pass through the window and all layers down to the mirror where the same light will be reflected back up through the same layers and out the window to a technician's eye. This happens because the polarization of the PLZT and the other polarizing plates have the same plane of polarization allowing the light to pass through. However, after a pulse of power from the test circuit, which rotates the plane of polarization of the PLZT plate, no light can pass through the stack of layers because the combined effect of the rotated plane of polarization in the PLZT plate and the opposite polarization of the other polarizers will prevent any light from passing through. The effect is very similar to a liquid crystal display, except that in a ferroelectric display indicator, the device is bistable and requires no additional power to sustain its state as in a liquid crystal display. Other materials which may be used as the polarizing crystal plate are Rochelle salt, monobasic potassium phosphate, ammonium sulfate, guanidinium aluminum sulfate hexahydrate, glycine sulfate, colemanite, thiorea, barium IV tinate-type (or perovskite-type) ferroelectrics, cadmium niobate, lead niobate, certain alums, such as methyl ammonium alum and ammonium cadmium sulfate, and even antiferroelectric materials.

The circuitry of this invention may be used in conjunction with any type of testing of any type of electronic component. Not only is it possible to have a permanent indication where there is no output, the oscillations, waveforms or frequency are not correct, the data is not correct, current or voltage ratio is not correct, or a fuse is blown, but it is also possible to have an indication where a self diagnosis of the circuitry has shown that one of the redundant circuits is inoperative. It must be appreciated that any feature of the electronic component can be monitored and, if certain conditions exist, the circuitry can generate a pulse to cause a visible charge in the indicator, thereby indicating on the surface of the component that there has been a deviation from certain stated conditions.

This invention provides numerous advantages which are not currently available in the electronic industry. A first advantage is that this invention provides an extremely inexpensive, easy, and quick method of identifying any fault or defective electronic component in or out of a circuit, just by looking at it. The visual appearance or color of the builtin embedded electronic component failure indicator, when activated, changes the visual appearance of the indicator portion of the faulty electronic component's surface so as to make that exact faulty, defective, or damaged component immediately identifiable by its changed appearance to a person looking for a failed component.

A second advantage is that person looking to find a failed electronic component in a circuit, can very easily, quickly and assuredly identify the exact location of a failed component in a circuit filled with hundreds of components by merely looking at the components in order to observe a visable change in the appearance of the builtin embedded electronic component failure indicator of the component which has failed. A repair technician does not have to look at any clipped-on or adhesively attached indicators on the component which could fall off, or any clamped on attachment indicators next to the failed component, any other remote external indicators, any nearby indicators external to the failed component, or any external displays external to the failed component to identify the failed component as had been required in the prior art.

A third advantage is that technician does not need to use any test equipment to find the failed component.

A forth advantage is that extremely rapid failed component identification can be made by consumers, industrial technicians, utility workers, astronauts, and military personnel by the use of electronic component failure indicators also allowing and enabling lower skill level personnel to maintain electronic equipment by easy identification of faulty, failed, damaged, and defective components. Then the task of removing and replacing defective components can be done in all types of equipment without the time, energy, weight, and cost of first testing with expensive test equipment operated by highly trained skilled technicians or by other methods and use of prior art systems previously used to locate failed components. An ordinary person can, for example find all the red marked components that are no longer black in a circuit board and have them replaced.

A fifth advantage of building a failure indicator into electronic components under test, space on a circuit board, and space above electronic components mounted on the circuit board, as well as the cost of such space and circuit board material can be saved from being used to accommodate the required extra space of circuit board mounted external indicators and clamped on indicators external to the electronic component under test as had been previously used in prior art.

A sixth advantage is that writing, markings, and values of the components are not obscured and covered by attachments in the present invention.

A seventh advantage is the ability to provide a failure indicator that is built into the surface of very small electronic components.

An eighth advantage is the provision of a failure indicator which will continue to indicate permanently that a component has failed, even after the flow of power has been discontinued, and even after the component is removed from the circuit. The builtin embedded failure indicator will be visable on the electronic component under test, indicating its status while the component is working well, on that same component if it fails, and on that same electronic component if it is detached, and removed from a circuit board and also when it is removed from a test equipment test fixture, all the while indicting the functional operational status of the electronic component.

There is a ninth advantage when a failure indicator continues to remain located within the electronic component to be monitored while it is under test, after it is tested, and before, during, and after the component is use in, detached from, and removed from a circuit, while it continues to travel with the component during its lifetime. The advantage is that the embedded failure indicating means is able to sustain its first and second states of appearance, indicating its status, without any power applied to it. This enables an electronic component with a builtin failure indicator to be used in an electronic circuit while working well, fail, be detached, and be removed from the electronic circuit and the electronic component failure indicator will still continue to show that the component has failed without any additional source of power to sustain the appearance change if the indicator immediately and for minutes, hours, days, weeks, and years after detachment and removal from the circuit board and its power supply.

A tenth advantage is that a component can be tested at a factory by test equipment, test itself while in a circuit because the component may have built-in selftest circuits, be tested by other external circuits and any and all of the testing circuits, if present are able to alternatively activate the embedded failure indicator at different times within the components lifetime.

The ability of a factory to test its components provides another advantage to the embedded indicator which is the ability of automatic test equipment or external test circuits to permanently mark and indicate on a component that it is defective, which will help to prevent the component from being mistakenly used.

An eleventh advantage is that all electrically energized embodiments of this invention require only a momentary pulse of power for a short duration to permanently mark and indicate a failure and no further power is required after that initial pulse.

It is an extremely valuable twelfth advantage that failed component identification in a circuit can be made very safely with the power off. And the simplicity of failed electronic component identification by the use of failure indicators embedded into electronic components thereby enables an average person, trained monkey, or even a machine vision system to identify a failed component in a very complex circuit filled with hundreds of components without complex technical training and without expensive test equipment enabling the average person to do complex do-it-yourself repairs saving enormous time energy and money.

A thirteenth advantage is that a failure of an electronic component under test can be identified by the test circuit and the failure can be described on the surface of the failed component in alphanumeric characters which need no power to sustain their diagnostic message on the surface of the electronic component.

A fourteenth advantage is that it provides a means of identifying what has failed within and electronic component, which will help identify other circuit problems. Another advantage is the ability to know what has not failed within a component by merely looking at it, and therefore to help identify and reuse undamaged circuit parts within a damaged integrated circuit or other electronic component.

A fifteenth advantage is the ability to look at a component and know that it is still probably in good working order, in a state of readiness, and able to work normally because there is no indication of failure. The visual appearance of the electronic component failure indicator, after it has been used once can be reset from its second state of visual appearance indicating faulty functional operation back to its first state of visual appearance indicating good functional operation after a fault is cleared if the component is still good. The component can be retried for proper functional operationality and useage, if the fault is not a permanent failure thereby enabling the component to be used again after being reset.

The invention is described in detail with reference to particular embodiments, but it should be understood that various other modifications can be effected and still be within the spirit and scope of the invention.

I claim:

1. An electronic component failure indicator for clearly visably indicating on the surface of an electronic component to be tested a self sustaining indication of the functional operational status of the component, and means for easily locating and identifying the exact used electronic component that has permanently failed, has become permanently damaged, and has become permanently defective while it is still in a circuit and also later after it is removed from a circuit without the need of test equipment, electrical power, and a trained technician, the invention comprised of:

an electronic component to be tested selected from one of the following group consisting of:

microprocessors, micro-controller ICs, operational amplifiers, RAMs, DRAMS, SDRAMS, PROMs, EEPROMs, timers, clocks, analog to digital converters, digital to analog converters, diodes, rectifiers, transistors, oscillators, SCRs, triacs, thyristors, FETs, MOSFETs, triggers, capacitors, transformers, display drivers, displays, photocouplers, LEDs, laser diodes, opto-isolators, optical integrated circuits, lasers, fluorescent lamps, incandescent light bulbs, other components containing light emitters which are used repeatedly, electron tubes, those components comprised of at least one semiconductor device, and those components comprised of at least one integrated circuit;

a failure indicating means;

a testing circuit means;

a power means;

said failure indicating means built into and embedded within said electronic component to be tested;

said failure indicating means is embedded within material which comprises the structural body of the electronic component to be tested so as to be visible on a surface of the electronic component;

said power means supplying electrical power to said testing means;

said testing circuit means monitoring at least one functional operational parameter selected, not necessarily from each, of the input functions, processing functions, and output functions of the electronic component under test, other than temperature and other than the monitoring and detection of electrostatic discharge events, to detect at least one operational parameter of the component which has deviated from a normal stated condition, such a deviation which is indicative that electronic component has permanently failed in some way, has become permanently damaged in some way, has become permanently defective in some way, and that at least one functional operational parameter of the electronic component will not be normal again as a result of such failure;

said failure indicating means electrically connected to said testing circuit means and to said power means;

said testing circuit means activating said failure indicating means by switching on power to it when at least one functional operational parameter of the electronic component under test deviates from a normal stated condition that is indicative of a permanent failure, defect, and damage of the component;

said builtin failure indicating means undergoing a permanent and irreversable visible change of appearance upon being activated by said power means;

said builtin failure indicating means indicating permanent failure upon receiving power from the said power means which causes the visual appearance of the builtin failure indicating means to permanently and irreversably change from a first state of visual appearance indicating that the electronic component is still good and functionally operational to a second permanent state of appearance indicating that the electronic component has permanently failed, is damaged, and is defective;

said builtin failure indicating means being able to sustain its first state of visual appearance and permanently sustain its second state of visual appearance without requiring a source of power for such sustanance.

2. An electronic component failure indicator according to claim 1, wherein said testing circuit means is also built within and contained within the electronic component under test, wherein the test circuit means built within the component can test the component itself for normal functional operationality.

3. An electronic component failure indicator according to claim 1, wherein a testing circuit means is external to the electronic component under test and electrical conductors are attached to the failure indicator in the electronic component and stick through the surface of the electronic component;

wherein the failure indicator of the component can be electrically connected through the said electrical conductors to and activated by a testing circuit means selected from at least one of the following group of testing circuits means consisting of:

a failure testing circuit means, contained on a circuit board, which is electrically connected to but remote from the electronic component under test, which can activate the electronic component failure indicator means embedded in the component under test also mounted on said circuit board;

a failure testing circuit means, built within a separate external electronic component, electrically connected to but remote from the electronic component being tested and monitored, which can remotely activate the failure indicator means embedded in the tested and monitored component;

and a testing circuit means, contained within external test equipment, external to and electrically connected to the electronic component under test, which can remotely activate the electronic component failure indicator means embedded in the component under test.

4. An electronic component failure indicator according to claim 1, wherein said failure indicating means includes a thermosensitive material that changes color upon being activated by said power means.

5. An electronic component failure indicator according to claim 1, wherein said failure indicator means includes a thermosensitive material;

said power means is electrically connected to said testing circuit means;

a heating means is electrically connected with said power means and said testing circuit means;

said thermosensitive material is positioned in juxtaposition to said heating means;

and wherein thermosensitive material permanently changes color upon being heated by said heating means which is energized by the power means when the testing circuit means turns on the power to the heating means.

6. An electronic component failure indicator according to claim 1, wherein the said failure indicating means is permanent, but not irreversable;

wherein said failure indicating means is resettable and further includes a means to reset the failure indicator means from said second state of appearance back to said first state of appearance.

7. An electronic component failure indicator according to claim 1, wherein the said failure indicator means is comprised of:

an electrosensitive material means;

said electrosensitive material selected from a group of materials which contain at least one of the following chemicals consisting of:

bromides, iodides, potassium salts, and any other chemicals which permanently and irreversably change color when electricity passes through them;

said electrosensitive material is positioned within the said electronic component so as to be visable on the surface of said component;

at least two conductive electrodes which touch at least two points on the electrosensitive material means, and two conductive connections, one to each said electrode;

and these said electrodes convey power to the builtin failure indicator when the said test circuit means switches power on to said electrosensitive material means through said conductive connections to the electrodes;

wherein the electrons within the electric current from said power source pass through the electrosensitive material, thereby permanently and irreversably electrochemically changing its color when the electrosensitive material means receives power from said power means.

8. An electronic component failure indicator according to claim 1, wherein the said builtin failure indicator means is further comprised of:

alphanumeric display characters made of electrochemical material means separated into segmented elements which compose the alphanumeric display characters on the surface of said electronic component;

means of electrically activating each segmented element to make a change from a first state of visual appearance to a second state of visual appearance of the segmented elements which comprise the alphanumeric display characters;

an electrical display driver means for each alphanumeric display segmented element which is electrically connected to and selectively turns on electrical power to said electrical activation means for each alphanumeric segmented element by supplying sufficient current to change the appearance of each segmented element from a first state of visual appearance to a second permanent state of visual appearance;

said alphanumeric character segmented elements made of electrochemical means being able to sustain their first state of visual appearance and permanently sustain their second state of visual appearance without requiring a source of power for such sustainance;

an alphanumeric display controller means electrically connected to and supplying binary information to control the alphanumeric display drivers means;

a testing circuit means which monitors at least one functional operational parameter of said electronic component and which is electrically connected to and supplies information to said alphanumeric display controller means;

the testing circuit means monitors the electrical functioning of the component, and if it detects a deviation from a state of normal operation indicative of permanent component failure, then it electrically provides test result information to the display controller which provides display control information to the display driver which supplies current to the electrical activation means to electrically change the appearance of the display elements from a first state of appearance to a second state of appearance requiring no source of power to sustain the first state of appearance and the second states of appearance of the alphanumeric display thereby indicating some diagnostic information about the failure alphanumerically displayed on the failed component's surface that the testing circuit detected.

9. An electronic component failure indicator according to claim 8, wherein the builtin failure indicator means includes an alphanumeric ferroelectric display indicator.

10. An electronic component failure indicator according to claim 8, wherein the builtin failure indicator means includes an alphanumeric antiferroelectric display indicator.

11. An electronic component failure indicator according to claim 8, wherein said failure indicator means includes electrosensitive material comprising said alphanumeric display elements;

said electrosensitive material selected from a group of materials which contain at least one of the following chemicals consisting of:

bromides, iodides, potassium salts, and any other chemicals which permanently and irreversably change color when electricity passes through them.

12. An electronic component failure indicator according to claim 8, wherein said failure indicator includes thermosensitive material means comprising said segmented elements comprising alphanumeric characters;

and further includes a matrix of heating elements means electrically connected with said power means and said alphanumeric display driver;

said thermosensitive material is positioned in juxtaposition to said matrix of heating elements;

and said thermosensitive material means comprising each said segmented element positioned in close proximity to each heating element so that the thermosensitive segmented elements can be heated to indicate said alphanumeric characters comprised of segmented elements made of thermosensitive material;

and wherein thermosensitive material segmented elements permanently changes color upon being heated by said matrix of heating elements which is energized by the said power means when said alphanumeric display controller supplies binary information to said alphanumeric display driver means which turns on power selectively to the each of the heating elements;

wherein when the alphanumeric display controller means which supplies binary information to the display driver means receives control information from said test circuit means, said display driver means turns on power to each heating element next to each segmented element comprising parts of an alphanumeric character made of thermosensitive material to produce an alphanumeric diagnostic message on the surface of the component monitored by the testing circuit.

13. An electronic component failure indicator according to claim 1, wherein said failure indicating means includes a metallic strip that visably changes position upon receiving power from said power means and said metallic strip is selected from one of the following group consisting of:

a strip made of a nitinol material which contains nickel titanium alloy which bends upon receiving power from said power means;

and a piezo electric bender which bends upon receiving power from said power means.

14. An electronic component failure indicator according to claim 1, wherein the electronic component is a resistor which includes a builtin failure indicator means and a builtin embedded testing circuit in the resistor comprised of at least one semiconductor device which monitors at least one electrical functional operational parameter of the resistor other than temperature and electrostatic discharge events.

15. An electronic component failure indicator according to claim 1, wherein the builtin failure indicator is an electrodeposition sealed cell comprised of a sealed layered sandwich including the following layers comprised of:

a layer comprised of a cathode means which may be selected from one of the group consisting of: transparent cathodes, translucent cathodes, and opaque cathodes;

a layer comprised of an anode means;

and a layer comprised of conductive electrolyte means between anode means and cathode means;

further comprised of a top transparent window layer cover means, positioned within the electronic component so that the window layer means is positioned at the surface of the component viewable from the outside of the component and the cathode means layer is visable through the window;

and when power is turned on by the said test circuit means to the anode means and cathode means, the anode means which is comprised of a metallic conductor, supplies metallic ions which travel through the conductive electrolyte means onto the conductive cathode means by electrodeposition, also called electroplating, which causes a visual change of appearance of the cathode viewable through the transparent window cover thereby causing a permanent visual change of the appearance of a portion of the surface of the electronic component in which the electrodeposition indicator cell is embedded.

16. An electronic component failure indicator according to claim 1, wherein the said failure indicating means is comprised of:

a sealed layered sandwich electrochemical acid-base indicator cell means including:

a top transparent window means, a layer comprised of a cathode means, a layer comprised of an anode means, conductive leads to anode and cathode, and a chemical acid-base indicator electrolyte layer means between the anode and the cathode;

and when a direct current is turned on by the said testing circuit means and applied between the anode and the cathode, electrolytic, electrophoretic, and electrodeposition action takes place though the conductive acid-base indicator electrolyte layer means which changes the PH and also changes the color of the acid-base indicator electrolyte layer which is visible through the said transparent window means positioned on the surface of the electronic component in which the failure indicator cell is embedded.

17. An electronic component failure indicator according to claim 1, wherein said failure indicating means includes a sealed electrochromic color change indicator cell means and is comprised of:

a top transparent window means;

a transparent first electrode means comprising a cathode made of vacuum deposited indium and tin oxides on the inside surface of the top glass window means a second electrode means, conductive leads attached to each electrode, a tungsten trioxide layer between the transparent first electrode and the second electrode, and sealing means which seal all layers together;

and when direct current is turned on between the two electrodes, electroplating action takes place upon the cathode electrode changing its color thereby making the color change cathode visable through the said window which is positioned on the surface of the electronic component in which the sealed electrochromic color change cell means is embedded.

18. An electronic component failure indicator according to claim 1, wherein said failure indicating means includes a viologen electrochromic failure indicator cell means and is comprised of:

a top transparent window means, a transparent first electrode means also called a cathode;

a second electrode means, a conductive lead attached to each electrode, an aqueous solution of a depositively charged organic salt electrolyte layer between the transparent electrode and the second electrode, a bottom plate housing means;

a seal means which seals the electrolyte into a cell comprised of the said top window means, said electrodes, said electrolyte, seal means, and bottom plate housing means;

and when direct current is turned on between the two electrodes wherein the transparent first electrode is made negative, the transparent electrode will change color as a result of electroplating action taking place upon the negative transparent first electrode which is visible as a color change through the said window which is positioned on the surface of the component in which the electrochromic cell is embedded.

19. An electronic component failure indicator according to claim 1, wherein the builtin failure indicator means is an electrodeposition indicator cell comprised of a sealed layered sandwich including;

a platinum cathode means, metal anode means, and lead solution electrolyte means between anode and cathode;

further comprised of a top transparent window layer cover means positioned within the electronic component so that the window layer is positioned at the surface of the component viewable from the outside of the component and the cathode layer is visable through the window;

and when power is turned on by the said test circuit means to the anode means and cathode means, lead peroxide is deposited onto the conductive cathode means by electrodeposition, also called electroplating, in the form of metallochromes also called Noboli's rings which are symmetrical rings of varied color which causes a visual change of appearance of the cathode means viewable through the said transparent window cover means thereby causing a visual change of the appearance of a portion of the surface of the electronic component in which the electrodeposition indicator cell is embedded.

20. An electronic component failure indicator according to claim 1, wherein said failure indicating means includes a liquid material means in a sealed housing, and at least two electrodes are electrically connected to said liquid material means, said test circuit means, and said power means, wherein some part of said liquid material means is caused to move upon being activated by said power means.

21. An electronic component failure indicator according to claim 1, wherein said failure indicating means includes a liquid material means in a sealed housing, and at least two electrodes are electrically connected to said liquid material means, said test circuit means, and said power means, and some part of the liquid material means is electrically caused to be modified to produce a visable permanent change of appearance in the failure indicator.

22. An electronic component failure indicator according to claim 1, wherein said failure indicating means includes a graphic representational visual indication of the operational status on the surface of an electronic component wherein, a dot matrix of electrochemical material means has been separated into segmented elements;

and is further comprised of means of electrically activating each segmented element to make a change from a first state of visual appearance to a second permanent state of visual appearance of the segmented elements;

wherein, an electrical display driver means for each segmented element which is electrically connected to said power means, said testing circuit means, a display controller means, and each element of the failure indicator means, and selectively turns on electrical power to said electrical activation means for each selected segmented element by supplying sufficient current to change the appearance of each segmented element from a first state of visual appearance to a second permanent state of visual appearance;

said segmented elements made of electrochemical means being able to sustain their first state of visual appearance and permanently sustain their second state of visual appearance without requiring a source of power for such sustainance wherein, a graphic representation and visible indication of the operational status on the surface of an electronic component comprised of a dot matrix of electrochemical material means separated into segmented elements may represent a graphic image selected from one of the following group of images:

a bar code image composed of segmented elements, an image of dots representing positions of components which have failed, a graphic event recorder, a graphic indication of redundancy circuit failure, a graphic indication of the number of redundant circuits that still work, and a graphic image of the circuit board and its components indicating by changed colored areas composed of dots which components on a circuit board have failed.

23. An electronic component failure indicator according to claim 1, wherein said electronic component contains an integrated circuit chip which performs at least one specific function and said testing circuit means is also built within and contained within said integrated circuit chip which performs at least one specific function;

and the testing circuit means tests at least one part of the integrated circuit chip that performs at least one specific function.

24. An electronic component failure indicator according to claim 1, wherein the builtin failure indicator includes a non-alphanumeric ferroelectric display indicator.

25. An electronic component failure indicator according to claim 1, wherein the builtin failure indicator includes a non-alphanumeric antiferroelectric display indicator.

26. An electronic component failure indicator according to claim 1, wherein the builtin failure indicator means includes any miniature electric motor means;

wherein the electric motor means is selected from the following group of electric motors consisting of:

rotary electric motors, electromagnetically driven motors, electrostatic motors, motors built by microfabrication techniques, motors built by micromachining, motors built by ion sputtering, and motors built by electrodeposition.

27. An electronic component failure indicator according to claim 1, wherein;

said failure indicating means is built within an integrated circuit and includes a heat sink means also built within the integrated circuit;

said heat sink means touches an integrated circuit substrate means within the integrated circuit and is long enough to extend through the surface of the said integrated circuit;

said failure indicating means also including thermosensitive material placed closely enough to said heatsink as to be able to thermally react to the heat from the heatsink conducted from the substrate so as to change the color of the thermosensitive material;

said thermosensitive material positioned so as to be visable on the surface of the integrated circuit;

said thermosensitive material changes color if the integrated circuit substrate excessively overheats as a result of the improved heat conduction from the substrate through the heat sink material to the thermosensitive material positioned substantially on the top portion of the heat sink on the surface of the component thereby heating said thermosensitve material causing a color change of said thermosensitive material.

28. An electronic component failure indicator according to claim 1, wherein said failure testing circuit means includes an electromagnetic pulse event detector means.

29. An electronic component failure indicator according to claim 1, wherein said failure testing circuit means includes an electrostatic discharge event detector means.

30. An electronic component failure indicator according to claim 2, wherein said electronic component failure indicator is further comprised of:

a testing circuit means built within and contained within the electronic component under test, and a builtin rechargeable battery built within the electronic component under test which is electrically connected to and which can alternatively supply power to the said testing circuit means.

31. A process of quickly, very easily, accurately, and assuredly testing, evaluating, and clearly visably indicating on the surface of an electronic component to be tested a self sustaining indication of the functional operational status of the component, and method for easily locating and identifying the exact used electronic component that has permanently failed while it is still in a circuit and also later after it is removed from the circuit without the need of test equipment and electrical power;

a) and determining whether the electronic component has permanently failed immediately, days, weeks, and years after being tested at a factory while it is loose and unattached;

b) and determining whether the electronic component has permanently failed after being used in, detached, and removed from an electronic circuit immediately, days, weeks, and years after it failed while loose and unattached;

c) and determining whether the electronic component has permanently failed as well determining the exact location of a failed electronic component while in a circuit even minutes, days, and years after power has been removed from the circuit, whereby one can find a bad component in a used printed circuit board even filled with hundreds of electronic components d) and determining which components are still good after being used in a circuit;

such determinations being made simply by looking at the component to see whether at least a portion of the electronic component has permanently changed its appearance, from a first state of appearance to a second state of appearance;

this method and process comprising:

building an electronic component from one electronic component to be tested selected from the one of the following group consisting of:

microprocessors, micro-controller ICs, diodes, operational amplifiers, DACs, SCRs, triacs, RAMs, SDRAMs, PROMs, EEPROMs, timers, rectifiers, transistors, display drivers, displays, oscillators, thyristors, FETs, MOSFETs, triggers, capacitors, opto-isolators, transformers, clocks, analog to digital converters, digital to analog converters, photocouplers, LEDs, DRAMs, laser diodes, electronic tubes, optical integrated circuits, lasers, fluorescent lamps, incandescent light bulbs, other components containing emitters of light used repeatedly, those electronic components comprised of at least one semiconductor device, and those electronic components comprised of at least one integrated circuit;

and embedding a failure indicator means into the body of the selected electronic component to be tested while making it so that the indicator is visable on the surface of said electronic component to be tested;

embedding the failure indicator means in the electronic component in a manner such that the same ordinary material means which usually comprises the structural body of the electronic component is at least one of the means of support of the embedded failure indicator embedded in the material means to hold the indicator in a position so as to be visable on the surface of the electronic component;

providing a power means to supply electrical power;

providing a testing means to test the component;

providing electrical power from power means to said testing circuit means by connecting said power means to the testing circuit means;

electrically connecting the failure indicator means with said testing circuit means and with said power means;

having the testing circuit means monitoring at least one functional operational parameter selected, not necessarily from each, of the input functions, processing functions, and output functions of the electronic component under test other than temperature and other than the monitoring and detection of electrostatic discharge events to detect at least one operational parameter of the component which has deviated from a normal stated condition such a deviation which is indicative that electronic component has permanently failed in some way, has become permanently damaged in some way, has become permanently defective in some way, and that at least one functional operational parameter of the electronic component will not be normal again;

having the testing circuit means turning on power to the failure indicator means if the testing circuit means detects that at least one said operational parameter of the electronic component deviates from a normal stated condition when such a deviation is indicative of permanent failure, damage and defect;

the power applied to the failure indicator means changing the appearance of the indicator from one state of appearance to a second permanent different state of appearance;

providing for said builtin failure indicating means to have means of sustaining its first state of visual appearance and means of permanently sustaining its second state of visual appearance without requiring a source of power for such sustainance so that then a person, by the process of observing and noticing that no change of appearance of the said electronic component in a circuit can determine that the component is still good, functionally operational, in a state of readiness, and is in a state of acceptable performance;

and, if there is a failure, so that then a person, by the process of observing, actively looking for, and noticing the change of appearance of the said builtin indicator portion of said electronic component in a circuit can determine that the component has failed as well as its location in the circuit.

32. A process of testing electronic components for failure, indicating failure in an electronic component, identifying exactly which electronic component has permanently failed among many electronic components, and the method of locating a permanently failed electronic component in and out of a circuit according to claim 31;

wherein, by building into and embedding within said electronic component said failure indicating means which includes a thermosensitive material means and a heater means, electrically connecting said power means to said testing circuit means;

electrically connecting a heating means to said power means and said testing circuit means;

and positioning said thermosensitive material in juxtaposition to said heating means;

wherein, thermosensitive material permanently changes color upon being heated by said heating means which is energized by the power means when the testing circuit means turns on the power to the heating means;

and the method of identifying and locating a permanently failed, damaged, and defective component is by observing, and actively looking at all components to see which have a change of appearance of the thermosensitive material of the said builtin indicator portion of the electronic component, and those components that have a change of appearance of their thermosensitive failure indicator can accurately be determined to have failed and those that do not have a change of appearance can be determined to still be good.

33. A process of indicating permanent failure in at least one electronic component, identifying exactly which electronic component has permanently failed among many electronic components, and the method of locating at least one permanently failed electronic component within a circuit according to claim 31, wherein, by making the failure indicator of electrosensitive material and by embedding the failure indicator within the electronic component under test, and further building it into the component so as to be visible on a surface of the component;

said electrosensitive material selected from a group of materials which contain at least one of the following chemicals consisting of:

bromides, iodides, potassium salts, and any other chemicals which permanently and irreversably change color when electricity passes through them; and providing for that when power is turned on to the failure indicator by the said test circuit means the electrosensitive material will permanently change color which can be observed by a person.

34. An electronic component failure indicator for clearly visably indicating on the surface of an electronic component to be tested a self sustaining indication of the functional operational status of the component, and means for easily locating and identifying the exact used electronic component that has permanently failed while it is still in a circuit and also later after it is removed from a circuit without the need of test equipment, a trained technician, and electrical power, the invention comprising;

an electronic component to be tested selected from one of the following group consisting of:

microprocessors, micro-controller ICs, operational amplifiers, RAMs, DRAMS, SDRAMS, PROMs, EEPROMs, timers, clocks, analog to digital converters, digital to analog converters, diodes, rectifiers, transistors, oscillators, SCRs, triacs, thyristors, FETs, MOSFETs, triggers, capacitors, display drivers, photocouplers, laser diodes, opto-isolators, optical integrated circuits, other components containing repeatedly used light emitters, electron tubes, those components comprised of at least one semiconductor device, and those components comprised of at least one integrated circuit;

a failure indicating means comprising at least a portion of the body of said electronic component;

a testing circuit means;

and a power means;

said power means supplying electrical power to said testing means;

said testing circuit means monitoring at least one functional operational parameter selected, not necessarily from each, of the input functions, processing functions, and output functions of the electronic component under test, other than temperature and other than the monitoring and detection of electrostatic discharge events, to detect at least one operational parameter of the component which has deviated from a normal stated condition, such a deviation which is indicative that electronic component has permanently failed in some way, has become permanently damaged in some way, has become permanently defective in some way, and that at least one functional operational parameter of the electronic component will not be normal again as a result of such failure;

said failure indicating means comprising at least a portion of the structural body of the electronic component under test and is integral with it;

at least a portion of the said structural body of the electronic component under test is made of the same material as said failure indicator means material and this same body of the component contains the primary functional operational portion of the said electronic component under test;

whereby the component itself serves as its own failure indicator;

wherein at least a portion of the structural body of the electronic component under test is itself also the failure indicator means for the electronic component by changing color when energised by said power means;

whereby the body may serve two functions, one being at least a partial container of the primary functional operational portion of the electronic component and the second being its functional operational status indicator when the primary functional operational portion is working well as well as when it fails;

said failure indicating means electrically connected to said testing circuit means and to said power means;

said testing circuit means activating said failure indicating means by switching on power to it when at least one parameter of the electronic component under test deviates from a normal stated condition such deviation indicative of permanent failure of the component;

the failure indicating means comprising at least a portion of the body of the electronic component under test is embedded in the component and positioned so as to be visible on at least one surface of the electronic component under test;

at least two conductive electrodes, to which the power means is connected, touch at least two points on the failure indicating material means, and at least two conductive connections are attached one to each electrode;

and these said electrodes convey power to the failure indicator means when the said test circuit means switches power on to the failure indicating means material through the electrodes said failure indicating means undergoing a permanent visible change of appearance upon being activated by said power means after being tested by the said testing circuit means if the testing circuit means detected deviation of a parameter of said component from a normal stated condition indicative of permanent failure, damage and defect;

said failure indicating means indicating failure upon receiving power from the said power means which causes the visual appearance of the failure indicating means to change from a first state of visual appearance indicating that the electronic component is still good and functionally operational to a second permanent state of appearance indicating that the electronic component has permanently failed;

said failure indicating means having means of sustaining its first state of visual appearance and means of permanently sustaining its second state of visual appearance without requiring a source of power for such sustainance.

35. An electronic component failure indicator according to claim 34, wherein said failure testing means includes an electromagnetic pulse event detector.

36. An electronic component failure indicator according to claim 34, wherein said failure testing means includes an electrostatic discharge event detector.

37. An electronic component failure indicator according to claim 34, wherein said failure indicator means is comprised of electrosensitive material means which permanently changes color when electrons pass through it;

and contains at least one chemical selected from the following group of chemicals consisting of:

iodides, bromides, potassium salts, and chemicals which permanently and irreversably change color when electricity passes through them;

and this electrosensitive material means is contained within at least a portion of the structural body of the component;

wherein at least two conductive electrodes touch at least two points on the failure indicating means;

wherein these said electrodes convey power to the failure indicator means when the said test circuit means switches power on to said failure indicating material means through the electrodes;

therefore, the color of the electrosensitive portion of the electronic component permanently changes when it receives power from the power means as electrons pass through the electrosensitive material;

whereby a substantially large portion of an electronic component can be caused to entirely change color indicating boldly to attract a person's attention that it has failed when a sufficient portion of the component's body is comprised of electrosensitive material.

38. An electronic component fault indicator for clearly visably indicating on the surface of an electronic component to be tested an indication of the functional operational status of said component, an indication of the occurrence of a circuit fault in that component, an indication of a state of readiness and acceptable performance of that component, an indication means to provide electronic circuit fault isolation to the component level, and means for easily locating and identifying the exact electronic component that has faulty operation while it is in and out of a circuit, without the need of electrical power, a highly trained technician, and any test equipment, the invention comprised of:

an electronic component to be tested selected from one of the following group consisting of;

ICs: microprocessors, micro-controller ICs, operational amplifiers, RAMs, DRAMs, SDRAMs, PROMs, EEPROMs, timer ICs, display drivers, oscillators, clocks, analog to digital converters ICs, digital to analog converters ICs, integrated circuits comprised of at least one integrated circuit chip, and any other integrated circuit, discrete semiconductor components: diodes, SCRs, triacs, transistors, thyristors, FETs, MOSFETs, rectifiers, triggers, and any other discrete semiconductor component, photocouplers, opto-isolaters, LEDs, laser diodes, optical integrated circuits, displays, fluorescent lamps, incandescent lamps, other components containing light emitters which are used repeatedly, and electron tubes;

a fault indicating means;

a fault testing circuit means;

a power means;

said fault indicating means built into the electronic component to be tested;

the builtin fault indicating means built into and embedded within the electronic component to be tested so as to be visible on a surface of the electronic component;

wherein at least two electrical conductors are attached to the fault indicating means;

said fault testing circuit means monitoring at least one functional operational parameter selected, not necessarily from each, of the input functions, processing functions, and output functions of the electronic component under test other than temperature and other than electrostatic discharge events said power means supplying electrical power to said fault testing means;

said fault indicating means electrically connected to said fault testing circuit means and to said power means;

said fault testing circuit means activating said fault indicating means by switching on power to it when at least one parameter of the electronic component under test deviates from a normal stated condition;

said builtin fault indicating means undergoing a visible change of appearance upon being activated by said power means after being tested by the said fault testing circuit means if the fault testing circuit means detected a deviation of at least one parameter of said component from said normal stated condition;

said builtin fault indicating means indicating a fault upon receiving power from the said power means, which causes the visual appearance of the builtin fault indicating means to change from a first state of visual appearance, indicating that the electronic component is working normally with no deviation from normal of its operational parameters being monitored, to a second state of appearance, indicating the occurrence of a fault, wherein, the electronic component has at least one of its functional operational parameters being monitored which has deviated from normal operation;

said builtin fault indicating means being able to sustain its first state of visual appearance and sustain its second state of visual appearance without requiring a source of power for such sustainance;

wherein the said fault indicating means is resettable and further includes a means to reset the fault indicator means from said second state of appearance back to said first state of appearance;

wherein the fault indicator means of the component is electrically connected through electrical conductors to and activated by a fault testing circuit means selected from at least one of the following group of fault testing circuit means consisting a fault testing circuit means, built within said electronic component under test, comprised of at least one semiconductor device, which which is electrically connected to and can activate its fault indicator means also embedded in said electronic component under test;

a fault testing circuit means, contained on a circuit board, comprised of at least one semiconductor device, which is electrically connected to but remote from the electronic component under test, which can activate the electronic component fault indicator means embedded in the component under test also mounted on said circuit board;

a fault testing circuit means, built within a separate external electronic component, comprised of at least one semiconductor device, electrically connected to but remote from the electronic component being tested and monitored, which can remotely activate the fault indicator means embedded in the tested and monitored component;

and a testing circuit means, contained within external test equipment, comprised of at least one semiconductor device, external to and electrically connected to the electronic component under test, which can remotely activate the electronic component fault indicator means embedded in the component under test.

39. An electronic component failure indicator according to claim 38, wherein the said builtin failure indicator is comprised of:

an electrosensitive material means;

said electrosensitive material means selected from a group of materials which can have reversable bistable appearances which contain at least one of the following chemicals consisting of:

liquid crystal materials used in bistable displays, ferroelectric materials, antiferroelectric materials, electrochromic materials used in bistable displays, and other chemicals which change color when electricity passes through them which have bistable characteristics and are able to hold two different states of appearances dependent upon the polarity of the electricity which last passed through them without the need of electrical power to sustain their last state of appearance;

bistable said electrosensitive material is contained within the fault indicator means and positioned within the said electronic component so as to be visable on the surface of said component;

at least two conductive electrodes which touch at least two points on the electrosensitive material means, and two conductive connections, one to each said electrode;

and these said electrodes convey power to the builtin failure indicator when the said test circuit means switches power on to said electrosensitive material means through said conductive connections to the electrodes;

wherein the electrons within the electric current from said power source pass through the electrosensitive material, thereby electrochemically changing its color when the electrosensitive material means receives power from said power means and this color change is reversable and electrically resettable by changing the polarity of power to the electrodes.

40. An electronic component fault indicator according to claim 39, wherein the said builtin fault indicator is further comprised of:

alphanumeric display characters made of electrochemical material means separated into segmented elements which compose the alphanumeric display characters on the surface of said electronic component;

means of electrically activating each segmented element to make a change from a first state of visual appearance to a second state of visual appearance of the segmented elements which comprise the alphanumeric display characters;

an electrical display driver means for each alphanumeric display segmented element which is electrically connected to and selectively turns on electrical power to said electrical activation means for each alphanumeric segmented element by supplying sufficient current to change the appearance of each segmented element from a first state of visual appearance to a second state of visual appearance;

said alphanumeric character segmented elements made of electrochemical means being able to sustain their first state of visual appearance and sustain their second state of visual appearance without requiring a source of power for such sustainance;

an alphanumeric display controller means electrically connected to and supplying binary information to control the alphanumeric display drivers means;

a testing circuit means which monitors at least one functional operational parameter of said electronic component and which is electrically connected to and supplies information to said alphanumeric display controller means;

a means to electrically reset the display elements from a said second state of appearance back to a said first state of appearance;

the testing circuit means monitors the electrical functioning of the component, and if it detects a deviation from a state of normal operation, it electrically provides test result information to the display controller which provides display control information to the display driver which supplies current to the electrical activation means to electrically change the appearance of the display elements from a first state of appearance to a second state of appearance requiring no source of power to sustain the first state of appearance and the second states of appearance of the alphanumeric display, thereby, providing some diagnostic information displayed on the surface of the component under test alphanumerically.

41. An electronic component fault indicator according to claim 40, wherein the builtin fault indicator includes a bistable alphanumeric ferroelectric display.

42. An electronic component fault indicator according to claim 40, wherein the builtin fault indicator includes a bistable alphanumeric antiferroelectric display.

43. An electronic component fault indicator according to claim 38, wherein, in addition to said fault testing circuit means an additional testing circuit means is included selected from at least one of the following group of additional testing circuit means consisting of:

electromagnetic pulse event detector testing circuit means;

and an electrostatic discharge event detector testing circuit means.

44. An electronic component fault indicator according to claim 38, wherein said component is an integrated circuit component, and is further comprised of:

a testing circuit means built within and contained within said integrated circuit component under test;

wherein said integrated circuit component contains at least one integrated circuit chip which performs at least one specific function and said testing circuit means is also built within and contained on said integrated circuit chip which performs at least one specific function;

wherein the testing circuit means includes, in addition to said fault testing circuit means, an additional testing circuit means included, selected from at least one of the following group of additional testing circuit means consisting of:

electromagnetic pulse event detector testing circuit means;

and an electrostatic discharge event detector testing circuit means;

wherein the test circuit means built within and contained on the integrated circuit chip can test the integrated circuit chip itself for normal functional operationality;

and a builtin rechargeable battery built within the electronic component under test which is electrically connected to and which can alternatively supply power to the said testing circuit means.

45. An electronic component fault indicator according to claim 1, wherein said failure indicating means includes a liquid material, some part of which is caused to move upon being activated by said power means.

46. An electronic component fault indicator according to claim 38, wherein said fault indicating means includes a metallic strip that visably changes position upon receiving power from said power means and said metallic strip is selected from one of the following group consisting of:

a strip made of a nitinol material which contains nickel titanium alloy which bends upon receiving power from said power means;

and a piezo electric bender which bends upon receiving power from said power means;

wherein said electronic component fault indicator further includes a mechanical latch means and a manual reset means.

47. An electronic component fault indicator according to claim 38, wherein the said fault indicator means does not sustain at least one of its two states of appearance without power applied to it;

wherein the builtin fault indicator means requires continuous power to sustain at least one of two states of appearance and includes at least two electrodes touching said fault indicator means and is electrically connected to said power means and test circuit means;

and further includes a reversable chemical display selected from one of the following group of displays consisting of:

a liquid crystal display, a thermosensitive material display heated by a heater means, an electrochromic display means, and an electrosensitive display means.

* * * * *